US009948179B2

(12) United States Patent
Kulkarni et al.

(10) Patent No.: US 9,948,179 B2
(45) Date of Patent: Apr. 17, 2018

(54) APPARATUS FOR CHARGE RECOVERY DURING LOW POWER MODE

(71) Applicant: Intel Corporation, Santa Clara, CA (US)

(72) Inventors: Jaydeep P. Kulkarni, Portland, OR (US); Pascal A. Meinerzhagen, Lausanne (CH); Dinesh Somasekhar, Portland, OR (US); James W. Tschanz, Portland, OR (US); Vivek K. De, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 54 days.

(21) Appl. No.: 15/032,981

(22) PCT Filed: Dec. 20, 2013

(86) PCT No.: PCT/US2013/077277
§ 371 (c)(1),
(2) Date: Apr. 28, 2016

(87) PCT Pub. No.: WO2015/094374
PCT Pub. Date: Jun. 25, 2015

(65) Prior Publication Data
US 2016/0294281 A1    Oct. 6, 2016

(51) Int. Cl.
*G05F 1/10*    (2006.01)
*G05F 3/02*    (2006.01)
(Continued)

(52) U.S. Cl.
CPC ............ *H02M 3/073* (2013.01); *G06F 3/041* (2013.01); *H02J 7/00* (2013.01); *H03K 3/0377* (2013.01); *H03K 19/21* (2013.01)

(58) Field of Classification Search
CPC .. H02M 3/073; H02M 3/07; H02M 2003/077; G11C 5/145; G05F 3/205
(Continued)

(56) References Cited

U.S. PATENT DOCUMENTS 5,402,063 A      3/1995   Kim
2010/0322027 A1* 12/2010  Russell ................. G11C 11/413
                                                  365/227

(Continued)

FOREIGN PATENT DOCUMENTS

CN    101630897    1/2010
CN    201477130    5/2010
(Continued)

OTHER PUBLICATIONS

Notification Concerning Transmittal of International Preliminary Report on Patentability issued for International Patent Application No. PCT/US2013/077277, dated Jun. 30, 2016.
(Continued)

*Primary Examiner* — Quan Tra
(74) *Attorney, Agent, or Firm* — Womble Bond Dickinson (US) LLP

(57) ABSTRACT

Described is an apparatus for power management. The apparatus comprises: a first power supply node; a second power supply node; a controllable device coupled to the first power supply node and to the second power supply node, the controllable device operable to short the first power supply node to the second power supply node; a load coupled to the second power supply node; and a charge recovery pump (CRP) coupled to the first and second power supply nodes.

25 Claims, 13 Drawing Sheets

(51) Int. Cl.
    *H02M 3/07* (2006.01)
    *H02J 7/00* (2006.01)
    *G06F 3/041* (2006.01)
    *H03K 3/037* (2006.01)
    *H03K 19/21* (2006.01)
(58) Field of Classification Search
    USPC .............................. 327/544, 536; 326/33–34
    See application file for complete search history.

(56) References Cited

U.S. PATENT DOCUMENTS

| | | |
|---|---|---|
| 2011/0127832 A1 | 6/2011 | Kundur Subramaniyan |
| 2011/0254616 A1* | 10/2011 | Kawano .................. H02M 3/07 327/536 |
| 2012/0051103 A1 | 3/2012 | Hosokawa et al. |
| 2013/0077411 A1 | 3/2013 | Nguyen et al. |
| 2015/0003174 A1* | 1/2015 | Joshi ..................... G11C 11/419 365/189.11 |
| 2015/0179247 A1* | 6/2015 | Meinerzhagen .... G11C 11/4074 365/158 |

FOREIGN PATENT DOCUMENTS

| | | |
|---|---|---|
| CN | 101753117 | 6/2010 |
| JP | 2010246204 | 10/2010 |
| KR | 100909637 | 7/2009 |
| TW | 259868 | 10/1995 |
| TW | 259868 | 11/1995 |
| WO | WO 2011014276 | 3/2001 |
| WO | 2011014276 | 2/2011 |

OTHER PUBLICATIONS

European Patent Application No. 13899423.1, European Search Report, dated Jul. 21, 2017, 14 pgs.
International Search Report dated Oct. 30, 2014 for PCT/US2015/094374, filed Sep. 29, 2014, 5 pages.
Written Opinion of the International Searching Authority dated Oct. 30, 2014 for PCT/US2013/076298, filed Dec. 18, 2013, 4 pages.

* cited by examiner

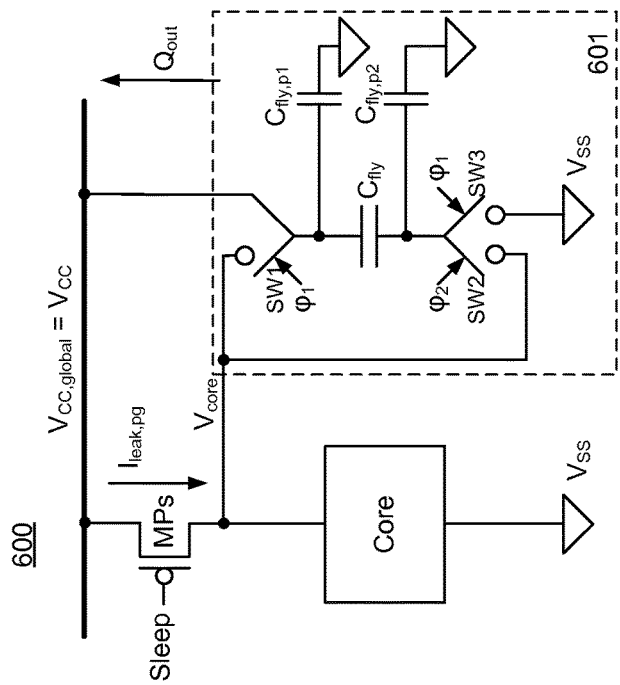
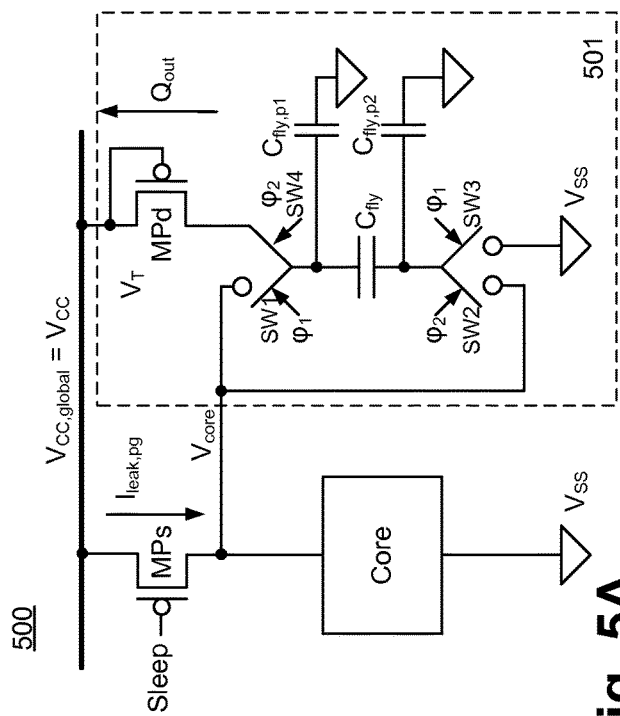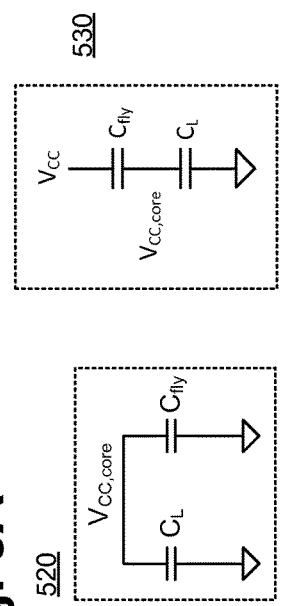
Fig. 5A   Fig. 5B   Fig. 5C   Fig. 6

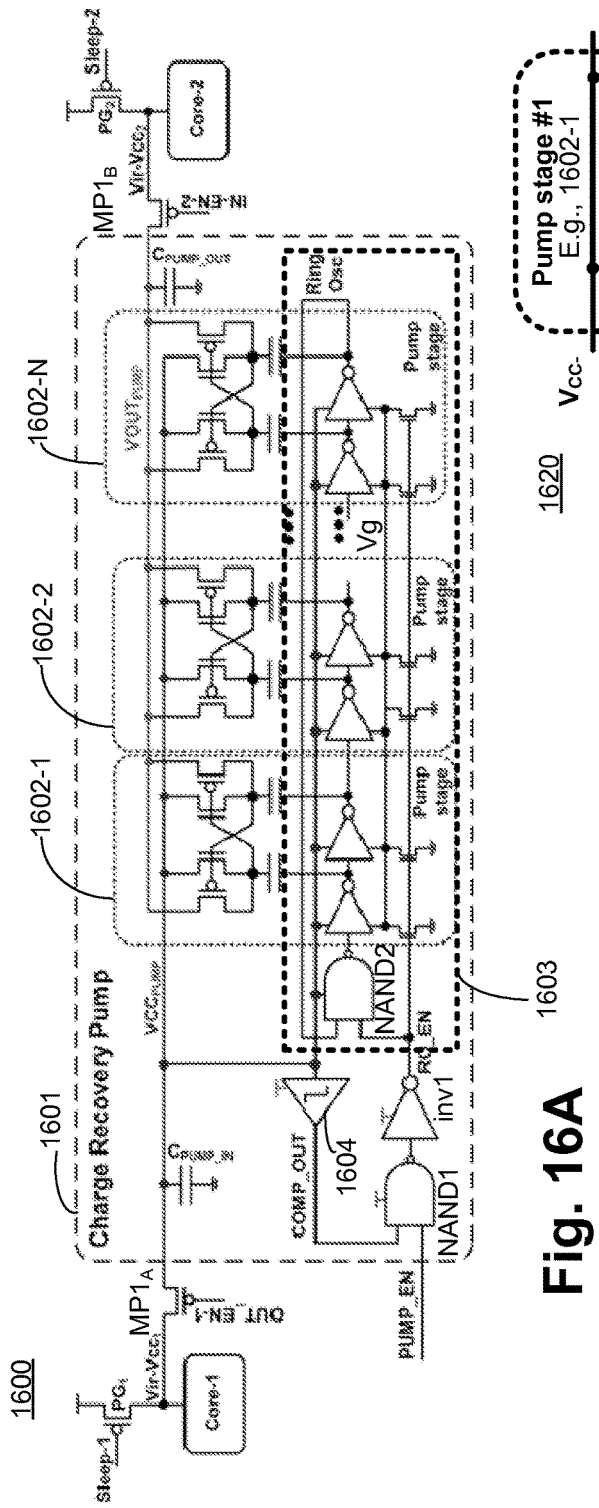
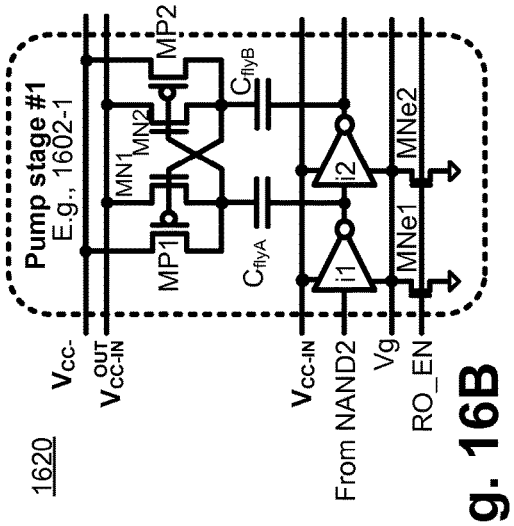
Fig. 16A
Fig. 16B

APPARATUS FOR CHARGE RECOVERY DURING LOW POWER MODE

RELATED APPLICATION

This patent application is a U.S. National Phase Application under 35 U.S.C. § 371 of International Application No. PCT/US2013/077277, filed Dec. 20, 2013, entitled APPARATUS FOR CHARGE RECOVERY DURING LOW POWER MODE.

BACKGROUND

Power-gating (e.g., Sleep-mode) is a popular technique to reduce power consumption of circuit blocks. During power-gating inactive circuit blocks are disconnected from the power supply to minimize leakage currents. One such conventional power gating scheme 100 is disclosed by FIG. 1A. Scheme 100 illustrates an external power source e.g., a Battery 101, which provides input supply to a voltage regulator (VR) 102. VR 102 then generates a regulated supply (having current $I_{ext}$) to a power supply node $V_{CC,global}$ of an integrated circuit (e.g., Chip 103). Here, Chip 103 includes a processing core (i.e., Core 104) which operates on a power on supply $V_{CC,core}$ provided by a p-type sleep transistor MPs. Core 104 is represented as a load having load capacitance $C_L$ and circuits that have leakage current $I_{leak}$. The sleep transistor MPs is controllable by a Sleep signal. When the sleep transistor MPs is turned ON, $V_{CC,global}$ is shorted with $V_{CC,core}$, and Core is provided with power to operate. When the sleep transistor MPs is turned OFF, $V_{CC,global}$ is disconnected from $V_{CC,core}$, and Core 104 is powered down i.e., power gated.

In conventional power-gating schemes, electrical charge residing on the capacitive power distribution network is lost through leakage currents of the power-gated circuit block. FIG. 1B illustrates a plot 120 of three waveforms associated with scheme 100 of FIG. 1A. Here, x-axis is time, and y-axis for the top two waveforms is voltage (ranging from Vcc to Vss) and the bottom waveform is current (ranging from 0A to $I_{active}$). The first signal from the top is Sleep signal. When Sleep is logical low, sleep transistor MPs is turned ON. When sleep transistor MPs is turned ON, $V_{CC,core}$ is the same as $V_{CC,global}$ (i.e., $V_{CC}$), and $I_{ext}$ is equal to $I_{active}$ (i.e., current consumed by active Core 104). When Sleep asserts i.e., Sleep signal transitions from logical low to logical high, sleep transistor MPs is turned OFF. Here, $V_{CC,core}$ is disconnected from $V_{CC,global}$. $V_{CC,core}$ then begins to decay (i.e., $C_L$ losses charge) through leakage current $I_{leak,ss}$, and reaches a steady state level of $V_{xss}$. This charge loss is a limitation of existing power gating schemes. When Sleep de-asserts, sleep transistor MPs is turned ON, and $V_{CC,core}$ rises to $V_{CC,global}$ (i.e., $V_{CC}$) level, and $I_{ext}$ becomes equal to $I_{active}$ (i.e., current consumed by active Core 104).

However, a shortcoming of conventional power-gating scheme 100 is that charges on the gated power grid (i.e., $V_{CC,core}$) leak away due to leakage currents in Core 104 after entering sleep state, and $V_{CC,core}$ is eventually discharged to a voltage level close to ground (i.e., final voltage level which is given by the voltage divider consisting of the high-impedance MPs header devices and the equivalent impedance of the core). Upon wake-up, (i.e., when MPs is turned ON) prior to resuming computation by Core 104, $V_{CC,core}$ is ramped up again, typically with a current $I_{ext}$ provided by external VR 102. The energy loss due to the unintended $V_{CC,core}$ line discharge and subsequent charging process preponderates in case of short sleep periods. The charge loss observed when Sleep is enabled (i.e., Sleep is logically high) limits the energy savings arising from power-gating, which leads to a minimum sleep time requirement for net energy savings, and consequently limits the frequentness of beneficially entering the sleep state.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 5A illustrates an apparatus with CRP implemented as a voltage doubler with diode switch, according to one embodiment of the disclosure.

FIG. 5B illustrates a capacitive model applicable during a first phase of the CRP of FIG. 5A, according to one embodiment of the disclosure.

FIG. 5C illustrates a capacitive model applicable during a second phase of the CRP of FIG. 5A, according to one embodiment of the disclosure.

FIG. 6 illustrates a CRP with voltage doubler without a diode switch, according to one embodiment of the disclosure.

FIG. 16A illustrates a multi-phase multi-stage voltage doubler based CRP, according to one embodiment of the disclosure.

FIG. 16B illustrates one of the stages of the multi-phase multi-stage voltage doubler based CRP of FIG. 16A, according to one embodiment of the disclosure.

DETAILED DESCRIPTION

Figure 1A:
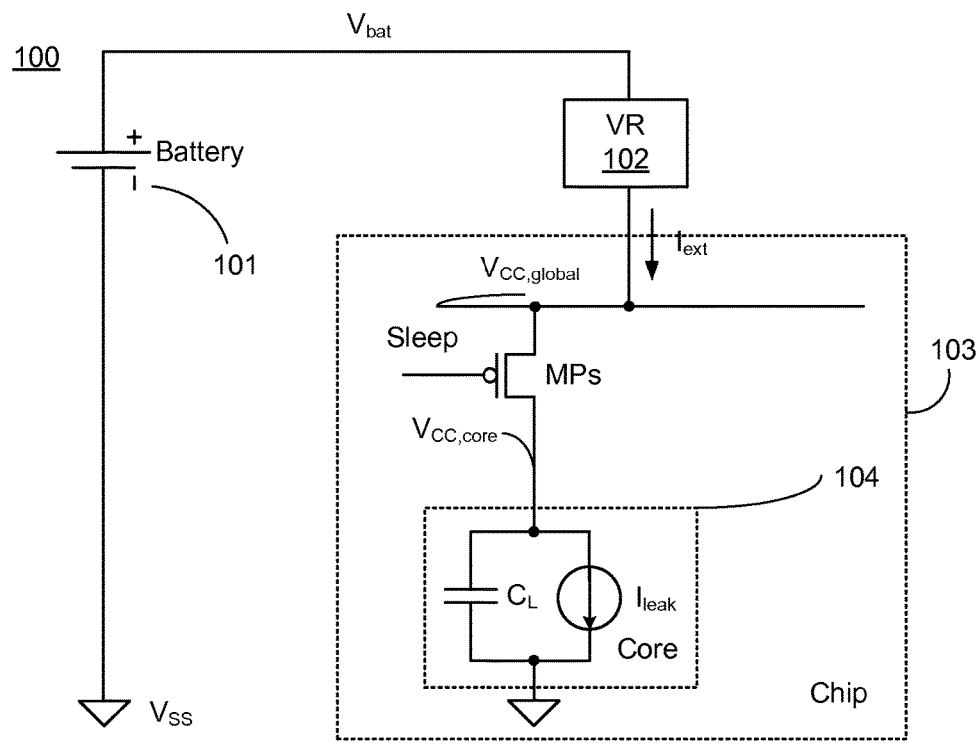
FIG. 1A illustrates a conventional power-gating scheme.
Figure 1B:
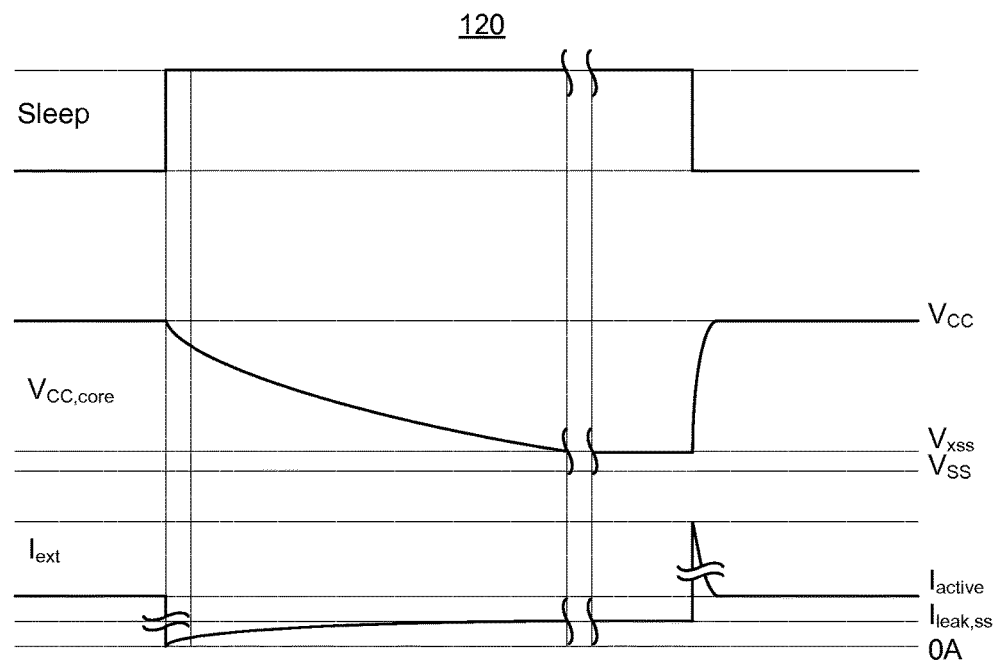
FIG. 1B illustrates a plot for various signals associated with the conventional power-gating scheme of FIG. 1A.

The embodiments describe an apparatus for recovering a maximum amount of charge from a capacitive power distribution network of a circuit block after or immediately after that circuit block has been power-gated. In one embodiment, the recovered charge can be supplied to active circuit blocks, returned to the battery or the main power supply of the SoC (System-on-Chip). In one embodiment, the recovered charge can be used again during wake-up of the power-gated circuit block. In such an embodiment, the current drained from the battery or main power supply is reduced. In one embodiment, the apparatus which comprises a Charge Recovery Pump (CRP) allows a processor or system to enter sleep mode more frequently due to a reduced minimum sleep time requirement for net energy savings (compared to baseline power gating without charge recovery), and therefore leads to longer battery life.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information/current flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 2A:
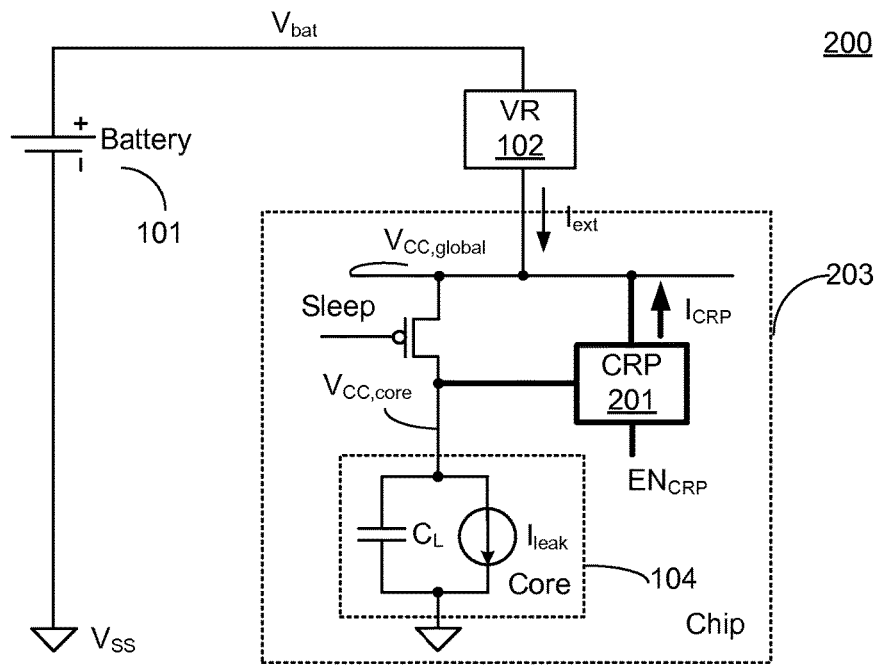
FIG. 2A illustrates a power-gating scheme with Charge Recovery (or Recycling) Pump (CRP), according to one embodiment of the disclosure.

FIG. 2A illustrates a power-gating scheme 200 with Charge Recovery (or Recycling) Pump (CRP), according to one embodiment of the disclosure. It is pointed out that those elements of FIG. 2A having the same reference numbers (or names) as the elements of any other figure can operate or function in any manner similar to that described, but are not limited to such.

In this embodiment, power-gating scheme 200 comprises Chip 203 which includes CRP 201, and is otherwise similar to power-gating scheme 100. In one embodiment, CRP 201 is coupled to $V_{CC,core}$ and $V_{CC,global}$ power supply nodes. In one embodiment, CRP 201 is operable to be enabled or disabled by $EN_{CRP}$ signal. In one embodiment, CRP 201 recovers charge from $V_{CC,core}$ (which has the load capacitor CO and provides current $I_{CRP}$ to $V_{CC,global}$ node.

In one embodiment, CRP 201 recovers a maximum amount of charge from $V_{CC,core}$ (i.e., capacitive power distribution network of Core 104) after or immediately after the circuit block has been power-gated. In one embodiment, the recovered charge can be supplied to active circuit blocks coupled to the $V_{CC,global}$ node, returned to battery 101 or the main power supply of the SoC. In one embodiment, the recovered charge is used again during wake-up of the power-gated Core 104. In such an embodiment, the current drained from the battery or main power supply is reduced. In one embodiment, CRP 201 allows Chip 203 or SoC to enter sleep mode more frequently due to a reduced minimum sleep time requirement for net energy savings (compared to baseline power gating without charge recovery), and therefore leads to longer battery life.

In one embodiment, Chip is a microprocessor SoC which comprises one or more computational cores. In one embodiment, Chip includes the sleep transistor MPs which is one or more PMOS header transistors operable to disconnect the local power distribution network $V_{CC,core}$ (e.g., individual to each core), from the global power distribution network $V_{CC,global}$ (e.g., shared among all cores). In this embodiment, the leakage current from the global power line $V_{CC,global}$ to ground (Vss) is substantially reduced upon assertion of the "Sleep" signal due to the turned OFF PMOS header devices exhibiting high impedance. In one embodiment, in order to alleviate charge loss on $V_{CC,core}$ to reduce $I_{ext}$, CRP 201 recovers much of the charge on $V_{CC,core}$ as possible before this charge leaks away. In one embodiment, the recovered charge is supplied to the global power line $V_{CC,global}$, to an Always-ON unit, or any active core/circuit block in form of the current $I_{CRP}$.

Figure 2B:
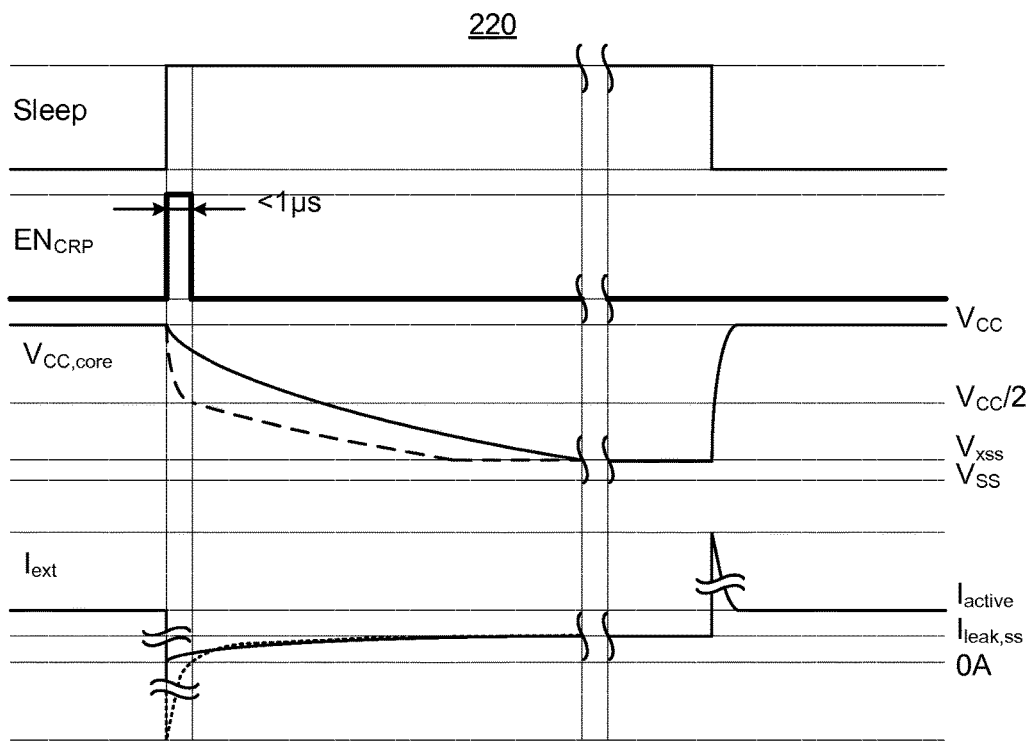
FIG. 2B illustrates a plot for various signals associated with the conventional power-gating scheme of FIG. 1A and charge recovery pump based power-gating scheme of FIG. 2A.

FIG. 2B illustrates a plot 220 for various signals associated with the power-gating scheme of FIG. 2A. It is pointed out that those elements of FIG. 2B having the same reference numbers (or names) as the elements of any other figure can operate or function in any manner similar to that described, but are not limited to such.

Here, x-axis is time, and y-axis for the top three waveforms is voltage (ranging from Vcc to Vss) and the bottom waveform is current (ranging from OA to $I_{active}$). The first signal from the top is Sleep. When Sleep is logical low, sleep transistor MPs is turned ON. When sleep transistor MPs is turned ON, $V_{CC,core}$ is the same as $V_{CC,global}$ (i.e., $V_{CC}$), and $I_{ext}$ is equal to $I_{active}$ (i.e., current consumed by the active Core 104). When Sleep asserts i.e., Sleep signal transitions from logical low to logical high, sleep transistor MPs is turned OFF. Here, $V_{CC,core}$ is disconnected from $V_{CC,global}$. The solid line $V_{CC,core}$ is $V_{CC,core}$ when CRP 201 is disabled. The dashed-line is $V_{CC,core}$ when CRP 201 is enabled for the duration of $EN_{CRP}$ pulse width. $EN_{CRP}$ is used to enable or disable CRP 201. In this example, CRP 201 is enabled for less than a us but can be higher in some other cases. During that pulse width of $EN_{CRP}$, CRP 201 recovers charge from $V_{CC,core}$ and provides it as current on $V_{CC,global}$.

The initial drop in the dashed $V_{CC,core}$ voltage level to Vcc/2 level is because of quick charge removal by CRP. As time progresses, $V_{CC,core}$ begins to decay (i.e., $C_L$ losses charge) through leakage current $I_{leak,ss}$, and reaches a steady state level of $V_{xss}$. When Sleep de-asserts, sleep transistor MPs is turned ON, and $V_{CC,core}$ rises to $V_{CC,global}$ (i.e., $V_{CC}$) level, and $I_{ext}$ becomes equal to $I_{active}$ (i.e., current consumed by the active Core).

Figure 3:
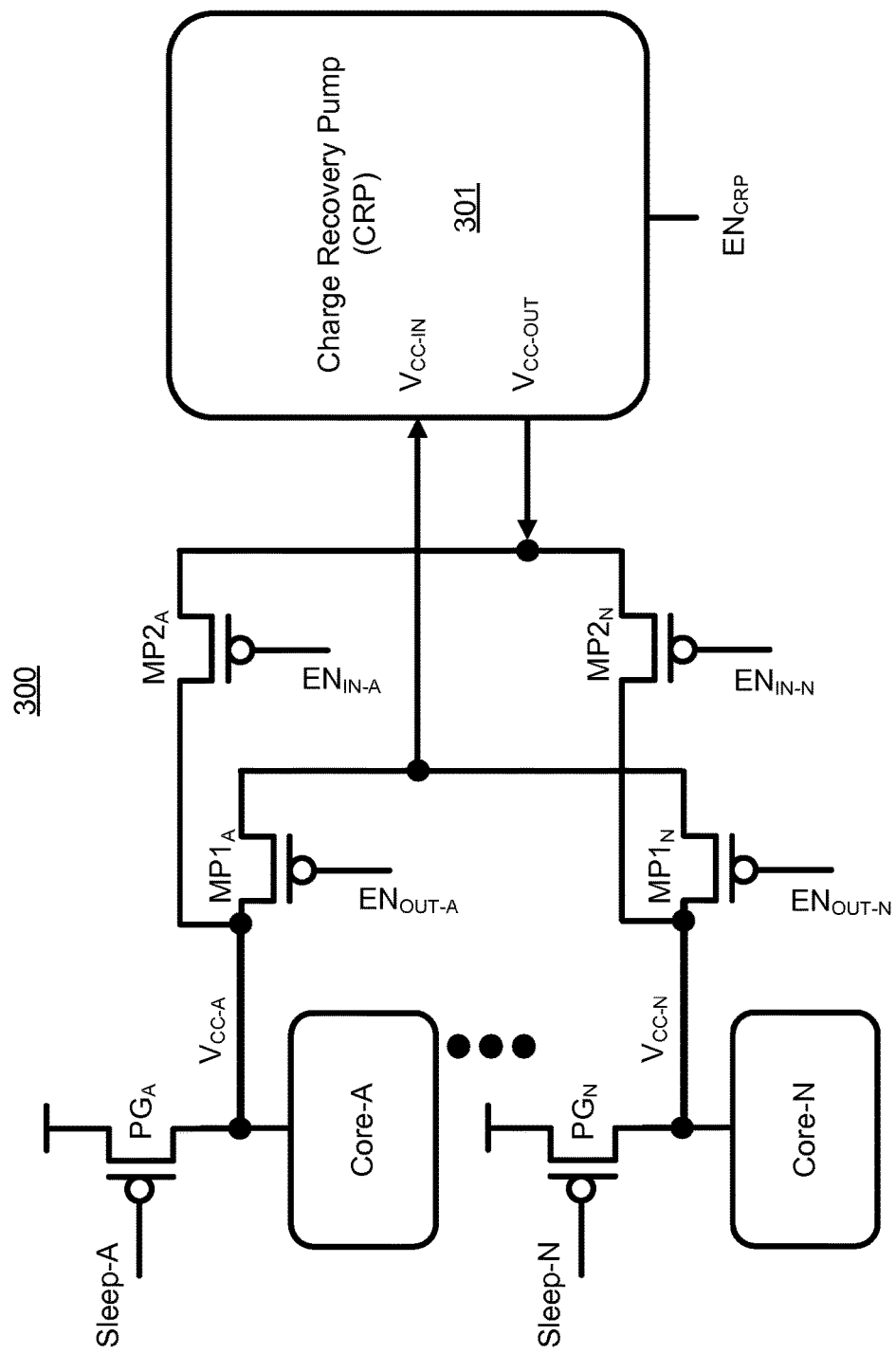
FIG. 3 illustrates a power-gating scheme with multiple processing cores (or units) and a shared CRP, according to one embodiment of the disclosure.

FIG. 3 illustrates a power-gating scheme 300 with multiple processing cores (or units) and a shared CRP, according to one embodiment of the disclosure. It is pointed out that those elements of FIG. 3 having the same reference numbers (or names) as the elements of any other figure can operate or function in any manner similar to that described, but are not limited to such.

In one embodiment, scheme 300 comprises CRP 301, switches $MP1_{A-N}$, $MP2_{A-N}$, Core-A to Core-N, and sleep transistors $PG_{A-N}$ (same as $MPs_{A-N}$). Here, the use of alphabets to show a number of devices or nodes is merely for example. Any number of devices or nodes may be used. In one embodiment, each sleep transistor is controlled by its respective sleep signal. For example, $PG_A$ is controlled by Sleep-A, $PG_B$ is controlled by Sleep-B, and so on. In one embodiment, switches $MP1_{A-N}$ are controlled by respective control signals $EN_{OUT-A}$ through $EN_{OUT-N}$ received by the respective gate terminals of switches $MP1_{A-N}$. In one embodiment, switches $MP2_{A-N}$ are controlled by respective control signals $EN_{IN-A}$ through $EN_{IN-N}$ received by the respective gate terminals of switches $MP2_{A-N}$.

In one embodiment, source/drain terminals of switches $MP1_{A-N}$ are coupled to $V_{CC-IN}$ terminal of CRP 301. In one embodiment, drain/source terminals of switches $MP1_{A-N}$ are coupled to respective local power supply nodes $V_{CC-A}$ though $V_{CC-N}$. In one embodiment, source/drain terminals of switches $MP2_{A-N}$ are coupled to $V_{CC-OUT}$ terminal of CRP 301. In one embodiment, drain/source terminals of switches $MP2_{A-N}$ are coupled to respective local power supply nodes $V_{CC-A}$ though $V_{CC-N}$. In one embodiment, each sleep transistor (also called power gate) from $PG_{A-N}$ is coupled to main (or global) power supply $V_{CC,global}$ and a respective local power supply node (e.g., one of $V_{CC-A}$ through $V_{CC-N}$).

In one embodiment, CRP 301 is a single CRP which is operable to recover charge from a local supply line (e.g., $V_{CC-A}$) associated with Core-A, which in this example is in sleep mode, and to transfer that recovered charge as supply voltage (or current) to another local supply line (e.g., $V_{CC-N}$) associated with an active Core-N, for example. Continuing with the example, since Core-A is in sleep mode because $PG_A$ is OFF, $MP1_A$ is turned ON by $EN_{OUT-A}$ so that CRP 301 can recover charge from $V_{CC-A}$. In one embodiment, for Cores which are in sleep mode, their respective switches MP2 are turned OFF. For example, if Core-A is turned OFF, then $MP2_A$ is turned OFF by $EN_{IN-A}$ signal.

Continuing with the example, Core-B through Core-(N−1) are in sleep mode, and so corresponding switches $MP1_B$ through $MP1_{(N-1)}$ are turned ON by their respective signals $EN_{OUT-B}$ to $EN_{OUT-(N-1)}$, and corresponding switches $MP2_A$ through $MP2_{(N-1)}$ are turned OFF by their respective signals $EN_{IN-A}$ to $EN_{IN-(N-1)}$, so CRP 301 can recover charges from nodes $V_{CC-B}$ through $V_{CC-(N-1)}$. In one embodiment, CRP 301 passes the recovered charge out on $V_{CC-Out}$ terminal of CRP 301 and eventually to those supply nodes for which the Core(s) are in active mode. In one embodiment, if none of the Cores are active, then CRP 301 stores the recovered charge on $V_{CC,global}$ or the battery.

In one embodiment, CRP 301 is enabled or disabled by $EN_{CRP}$ signal. In one embodiment, CRP 301 is enabled for short duration of time to recover charge. In one embodiment, CRP 301 is enabled if at least one of the Cores is in sleep mode. In one embodiment, if none of the Cores are in sleep mode (i.e., the Cores are active), then CRP 301 is disabled using $EN_{CRP}$ signal. In one embodiment, signals $EN_{IN-A}$ through $EN_{IN-N}$, signals $EN_{OUT-A}$ through $EN_{OUT-N}$, and signal $EN_{CRP}$ are generated by a finite state machine (not shown).

Figure 4:
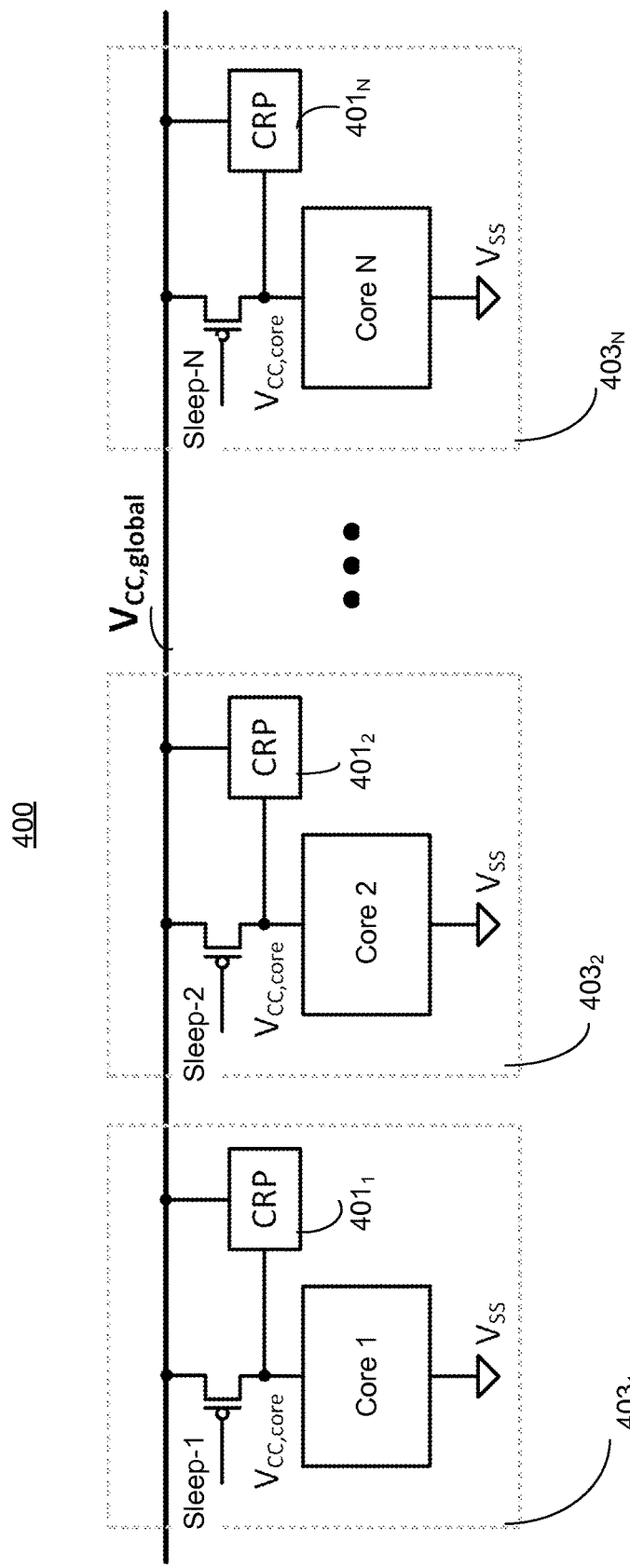
FIG. 4 illustrates a power-gating scheme with shared global supply node, and multiple processing cores (or units) each having its own CRP, according to one embodiment of the disclosure.

FIG. 4 illustrates a power-gating scheme 400 with shared global supply node, and multiple processing cores (or units) each having its own CRP, according to one embodiment of the disclosure. It is pointed out that those elements of FIG. 4 having the same reference numbers (or names) as the elements of any other figure can operate or function in any manner similar to that described, but are not limited to such.

In one embodiment, scheme 400 comprises a plurality of CRPs $401_{1-N}$, where 'N' is an integer greater than one. In one embodiment, scheme 400 further comprises a plurality of processing units $403_{1-N}$ each of which having its respective CRP. In one embodiment, each processing unit is similar to apparatus of FIG. 2A. Referring back to FIG. 4, in one embodiment, each core has its own CRP feeding the global power line $V_{CC,global}$. This modular approach can easily be amended to ever more complex SoCs with a steadily increasing number of cores without extra design effort for more complex interconnection networks. In one embodiment, each Core is coupled to a sleep transistor which is controllable by a corresponding Sleep signal. For example, Sleep transistor coupled to Core 1 is controllable by Sleep-1 signal, and Sleep transistor coupled to Core 2 is controllable by Sleep-2 signal. In one embodiment, each sleep transistor can be independently controlled.

In one embodiment, CRP of the processing unit, for which the sleep transistor is OFF, is enabled to recover charge from local $V_{CC,core}$ node to $V_{CC,global}$ node. In one embodiment, CRP of the processing unit, for which the sleep transistor is turned ON, is disabled and charge added to $V_{CC,global}$ from another CRP is used by the active core.

FIG. 5A illustrates an apparatus 500 with CRP implemented as a voltage doubler with diode switch, according to one embodiment of the disclosure. It is pointed out that those elements of FIG. 5A having the same reference numbers (or names) as the elements of any other figure can operate or function in any manner similar to that described, but are not limited to such.

In one embodiment, apparatus 500 comprises CRP 501, Sleep transistor MPs, and Load (e.g., Core, memory, or any device that can enter and exit sleep modes). In one embodiment, CRP 501 comprises a first switch SW1, second switch SW2, third switch SW3, diode switch MPd, and flying capacitor $C_{fly}$. For completeness sake, parasitic capacitances $C_{fly,p1}$ and $C_{fly,p2}$ on each terminal of the flying capacitor $C_{fly}$ are shown. In one embodiment, SW1 is controllable by a first phase $\Phi_1$ of a periodic signal. In one embodiment, SW2 is controllable by a second phase $\Phi_2$ of the periodic signal. In one embodiment, SW3 is controllable by a first phase $\Phi_1$ of the periodic signal.

In one embodiment, SW1 is operable to couple or decouple a first terminal of flying capacitor $C_{fly}$ to $V_{core}$ (also referred as $V_{CC,core}$). In one embodiment, SW2 is operable to couple or decouple another terminal (i.e., second terminal) of flying capacitor $C_{fly}$ to $V_{core}$. In one embodiment, SW3 is operable to couple or decouple the second terminal of flying capacitor $C_{fly}$ to $V_{ss}$. In one embodiment, SW4 is operable to couple or decouple a first terminal of flying capacitor $C_{fly}$ to the drain terminal of diode switch MPd, where the gate terminal of MPd is coupled to its source terminal $V_{CC}$ (same as $V_{CC,global}$).

FIG. 5B illustrates a capacitive model 520 during a first phase of the CRP of FIG. 5A, according to one embodiment of the disclosure. It is pointed out that those elements of FIG. 5B having the same reference numbers (or names) as the elements of any other figure can operate or function in any manner similar to that described, but are not limited to such. In one embodiment, during first phase $\Phi_1$ of a periodic signal, SW1 and SW3 are closed and SW2 and SW4 are open causing flying capacitor $C_{fly}$ to be coupled in parallel to load capacitor $C_L$. Here, load capacitor $C_L$ is the lumped load representing the Core and is coupled to $V_{core}$ (same as $V_{cc,core}$) node and ground.

FIG. 5C illustrates a capacitive model 530 during a second phase of the CRP of FIG. 5A, according to one embodiment of the disclosure. It is pointed out that those elements of FIG. 5C having the same reference numbers (or names) as the elements of any other figure can operate or function in any manner similar to that described, but are not limited to such. In one embodiment, during second phase $\Phi_2$ of a periodic signal, SW1 and SW3 are open, and SW2 and SW4 are closed causing flying capacitor $C_{fly}$ to be coupled in series to load capacitor $C_L$. In one embodiment, the first phase does not overlap the second phase.

Referring back to FIG. 5A, voltage-doubler CRP 501 is implemented as a switched-capacitor (SC) circuit. The operation of this circuit is based on two non-overlapping clock phases (i.e., $\Phi_1$ and $\Phi_2$). During second phase $\Phi_1$, "flying" capacitor $C_{fly}$ is coupled in parallel with the Core capacitor $C_L$. Here, $C_L$ is an equivalent, lumped representation of the total decoupling and parasitic capacitances of the power distribution network of the power-gated Core (or circuit block in general). In one embodiment, charge sharing between the two capacitors $C_L$ and $C_{fly}$ occurs until both capacitors exhibit the same voltage across them $V_{CC,core}$. In one embodiment, upon completion of charge sharing, second phase $\Phi_2$ is initiated, during which $C_{fly}$ is coupled in series with $C_L$. In one embodiment, after switching to the second phase $\Phi_2$ (e.g., immediately after), the open-circuit voltage $V_{boost}$ at the top plate of $C_{fly}$ is equal to $2V_{CC,core}$. In this embodiment, elevated potential $2 \times V_{CC,core}$ (which is higher than the potential $V_{CC,global}$ of the global power line) causes a current flow $I_{CRP}$ (or charge $C_{out}$) from the capacitors to the global power line.

In one embodiment, discharging the series-coupled $C_L$ and $C_{fly}$ capacitors to the $V_{CC,global}$ potential completes the first iteration of charge recycling. In one embodiment, at the end of this first iteration, the flying capacitor $C_{fly}$, which may be much smaller than $C_L$, is almost completely discharged, while the voltage across $C_L$ is slightly reduced. In one embodiment, the second iteration is initiated by entering the first phase $\Phi_1$ again in order to again charge the flying capacitor $C_{fly}$ from $C_L$ and to again recover some charge during the subsequent second phase $\Phi_2$. This cycling from the parallel to the series connection of $C_{fly}$ and $C_L$ is repeated for a given number 'n' of iterations, until the amount of charge recovered at each iteration is diminishingly small.

In one embodiment, diode switch MPd is a unidirectional switch. In one embodiment, MPd avoids reverse current flow from the global, regulated power line into the flying capacitors $C_{fly}$ of CRP 501. For example, when $V_{CC,core}$ of the voltage-doubler 501 depletes below $V_{CC}/2$ due to parasitic capacitances (e.g., $C_{fly,p1}$ and $C_{fly,p2}$) and core leakage currents, reverse current flows from $V_{CC,global}$ to $C_{fly}$. However, unidirectional output switches like MPd may have the drawback of a threshold voltage ($V_T$) drop (i.e., voltage-doubler 501 already stops to deliver an output current when $V_{CC,core}=(V_{CC}+V_T)/2$.

FIG. 6 illustrates an apparatus 600 with CRP implemented as a voltage doubler without a diode switch, according to one embodiment of the disclosure. It is pointed out that those elements of FIG. 6 having the same reference numbers (or names) as the elements of any other figure can operate or function in any manner similar to that described, but are not limited to such.

So as not to obscure the embodiments, apparatus 600 is described with reference to FIG. 5A. Components previously discussed are not repeated again for simplicity. In this embodiment, apparatus 600 comprises CRP 601 having an output directly coupled to $V_{CC,global}$ node without intermediate diode switch MPd of FIG. 5A. Here, CRP 601 is also a voltage doubler that operates the same way as voltage doubler 501. Compared to apparatus 500, apparatus 600 exhibits a higher charge recovery efficiency ($\eta = Q_{out}/Q_{init}$, where $Q_{out}$ and $Q_{init}$ are the total recovered and the total initial charge, respectively), provided that CRP 601 is stopped at an optimum time before the reverse current becomes dominant. In one embodiment, self-stop circuits are provided for detecting the optimum CRP stop time. Self-stop circuits are discussed with reference to FIGS. 12-13.

Figure 7:
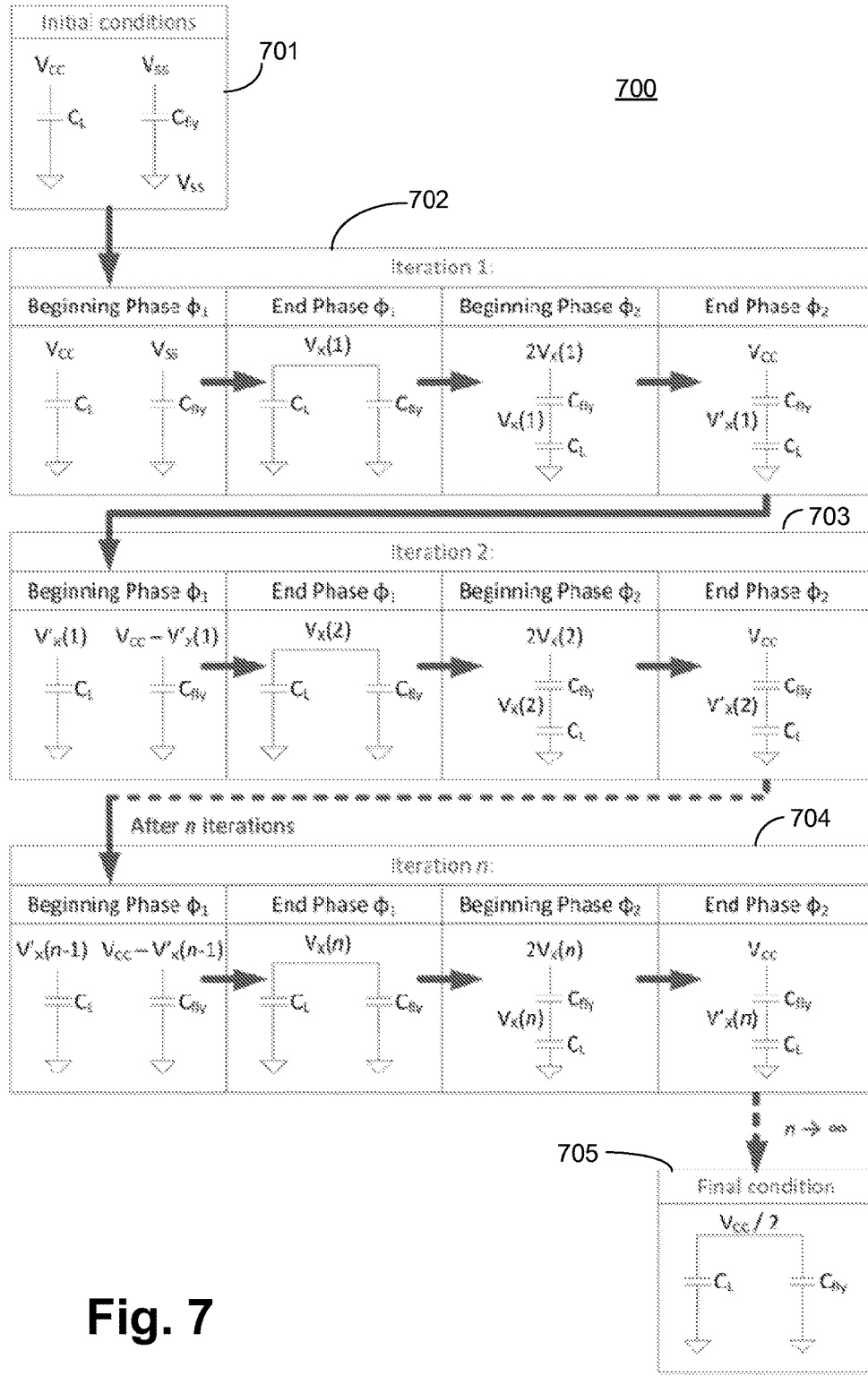
FIG. 7 illustrates operation of CRP with voltage doubler from initial conditions to final conditions, according to one embodiment of the disclosure.

FIG. 7 illustrates a flowchart 700 showing operation of CRP 601 with voltage doubler from initial conditions to final conditions, according to one embodiment of the disclosure. It is pointed out that those elements of FIG. 7 having the same reference numbers (or names) as the elements of any other figure can operate or function in any manner similar to that described, but are not limited to such.

Flowchart 700 illustrates operation of the voltage-doubler CRP 601, covering all steps from initial conditions, through all phases of the first two iterations, to any intermediate iteration 'n', and to the final conditions. The initial conditions are shown by block 701. First iteration is shown by block 702. Second iteration is shown by block 703, and nth iteration is shown by clock 704. In each iteration, voltages on capacitors $C_L$ and $C_{fly}$ are shown at the beginning of the first phase $\Phi_1$, end of the first phase $\Phi_1$, beginning of the second phase $\Phi_2$, and end of the second phase $\Phi_2$. Final condition is shown by block 705.

As shown in block 701, $C_L$ is assumed to be charged to $V_{CC,global}$ which is equal to $V_{CC}$ initially, while $C_{fly}$ is assumed to be fully discharged initially. It is further assumed that the recovered charge is delivered to a power line with potential $V_{CC,global}=V_{CC}$. After a large number of iterations, the ramped-down voltage of the gated core $(V_x(n)=V_{CC,core})$ approaches a final value of $V_{CC}/2$ in the ideal case (disregarding both parasitic capacitances and leakage currents). Here, as soon as $C_{fly}$ and $C_L$ exhibit a voltage of $V_{CC}/2$ for the parallel connection, they reach an open-circuit voltage of $V_{CC}$ for the series connection, i.e., a voltage equal to the potential of the target power line, and cannot deliver any further charge to the load. For the case of voltage-tripler configuration with two flying capacitors, as discussed with reference to FIGS. 9A-B, an additional amount of charge is recovered until $V_{CC,core}$ reaches a value of $V_{CC}/3$.

Figure 8:
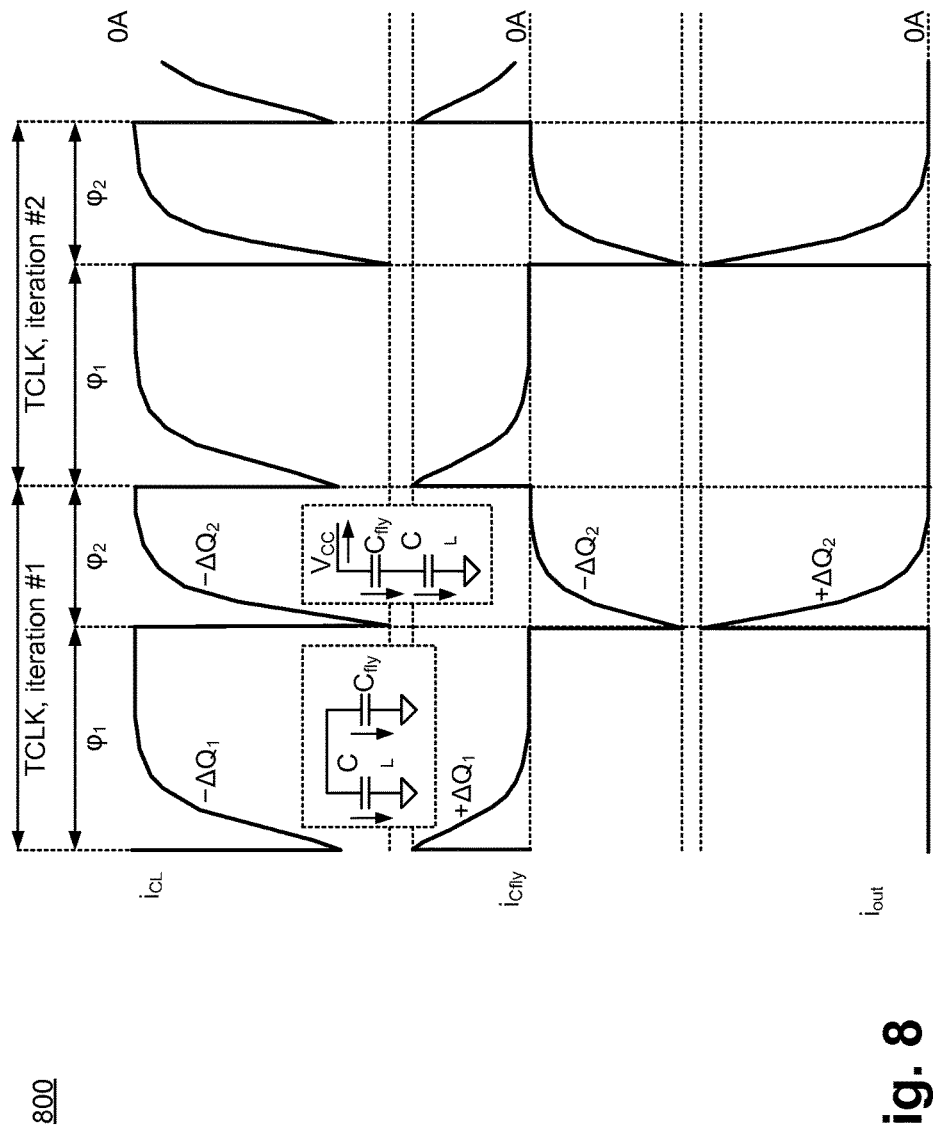
FIG. 8 illustrates a plot showing current during charge recovery over multiple iterations and phases.

FIG. 8 illustrates a plot 800 showing current during charge recovery over multiple iterations and phases. It is pointed out that those elements of FIG. 8 having the same reference numbers (or names) as the elements of any other figure can operate or function in any manner similar to that described, but are not limited to such.

Plot 800 shows three current waveforms. Here, x-axis is time and y-axis for each waveform is current. The first waveform from the top is current $i_{CL}$ through load capacitor $C_L$ for two iterations of TCLK (i.e., periodic clock). For each iteration, current behavior is shown during the first phase $\Phi_1$ and during the second phase $\Phi_2$. The second waveform from the top is current $i_{Cfly}$ through flying capacitor $C_{fly}$ for two iterations of TCLK. The third waveform from the top is output current $i_{out}$ provided to node $V_{CC,global}$ for two iterations of TCLK. For simplicity, the first iteration is discussed. The second iteration behaves similar to the first iteration.

During the first iteration and during the first phase $\Phi_1$, $C_L$ and $C_{fly}$ are coupled together in parallel. Initially charge $\Delta Q_1$ on $C_L$ is discharged (hence the negative sign on $\Delta Q_1$) and current $i_{CL}$ is used to charge $C_{fly}$. Accordingly, $i_{Cfly}$ is positive because $C_{fly}$ receives $\Delta Q_1$ from $C_L$ (hence the positive sign on $\Delta Q_1$). During the second phase $\Phi_2$, $C_L$ and $C_{fly}$ are coupled together in series. Here, charge $\Delta Q_2$ on $C_L$ is discharged (hence the negative sign on $\Delta Q_2$). During second phase $\Phi_2$, $C_{fly}$ is coupled to $V_{CC,global}$ and charge from $C_{lfy}$, is provided to $V_{CC,global}$ which is indicated by $-\Delta Q_2$ (the negative sign on $\Delta Q_2$ indicates charge lost by $C_{lfy}$), hence negative direction of $i_{Cfly}$. This lost charge is gained by $V_{CC,global}$ as its capacitance (i.e., distributed capacitance on node $V_{CC,global}$) is charged by current $i_{out}$ which provides charge $\Delta Q_2$ to node $V_{CC,global}$. For ideal case, in a voltage doubler configuration of CRP, charge recovery efficiency is 25%. Here, charge recovery efficiency is defined as a ratio of $Q_{out}$ to $Q_{init}$ which are the total recovered and the total initial charge, respectively.

Figure 9A:
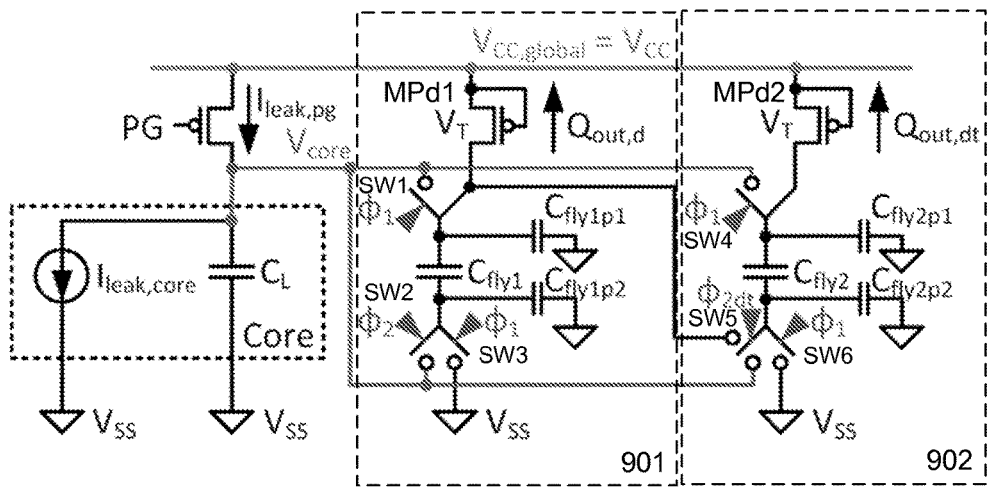
FIG. 9A illustrates an apparatus with a hybrid voltage doubler and tripler CRP with diode switch, according to one embodiment of the disclosure.

FIG. 9A illustrates an apparatus 900 with a hybrid voltage doubler and tripler CRP with diode switch, according to one embodiment of the disclosure. It is pointed out that those elements of FIG. 9A having the same reference numbers (or names) as the elements of any other figure can operate or function in any manner similar to that described, but are not limited to such.

In one apparatus 900 comprises a voltage doubler based CRP 901, a voltage tripler based CRP 902, load (i.e., Core) represented by leakage current source $I_{leak,core}$ and lumped capacitance $C_L$, and sleep transistor PG controllable by a sleep signal. Here, voltage doubler based CRP 901 is the same as voltage doubler based CRP 501. For voltage doubler based CRP 901, the flying capacitor $C_{fly}$ is the first flying capacitor $C_{fly,1}$, and the associated parasitic capacitors are $C_{fly1,p1}$ and $C_{fly1,p2}$, and the diode switch MPd is the first diode switch MPd1. In one embodiment, CRP 901 and 902 together allow to recover an additional amount of charge until $V_{CC,core}$ reaches a value of $V_{CC}/2$. As discussed with reference to FIG. 5A, a voltage doubler alone can ideally recover charge until $V_{CC,core}$ reaches a value of $V_{CC}/2$.

Referring back to FIG. 9A, in one embodiment, voltage tripler based CRP 902 comprises a fourth switch SW4 controllable by the first phase $\Phi_1$, fifth switch SW5 controllable by a gated second phase $\Phi_{2dt}$ (which causes SW5 to turn on only when voltage tripler is enabled), sixth switch SW6 controllable by the first phase $\Phi_1$, second flying capacitor $C_{fly2}$ and its associated parasitic capacitors $C_{fly2,p1}$ and $C_{fly2,p2}$, and second diode switch MPd2.

In one embodiment, SW5 is operable to couple or decouple the first terminal of $C_{fly2}$ to $V_{core}$ (same as $V_{CC,core}$). In one embodiment, SW5 is operable to couple a second terminal of $C_{fly2}$ to $V_{core}$. In one embodiment, SW6 is operable to couple the second terminal of $C_{fly2}$ to ground. In one embodiment, second diode switch MPd2 has a drain terminal coupled to the first terminal of $C_{fly2}$ and source and gate terminals coupled to $V_{CC,global}$. One technical effect of having the first and second diode switches MPd1 and MPd2 respectively is to prevent reverse current from discharging $V_{CC,global}$. In one embodiment, first and second diode switches MPd1 and MPd2 are removed and first terminals of $C_{fly1}$ and $C_{fly2}$ are directly coupled to $V_{CC,global}$.

Figure 9B:
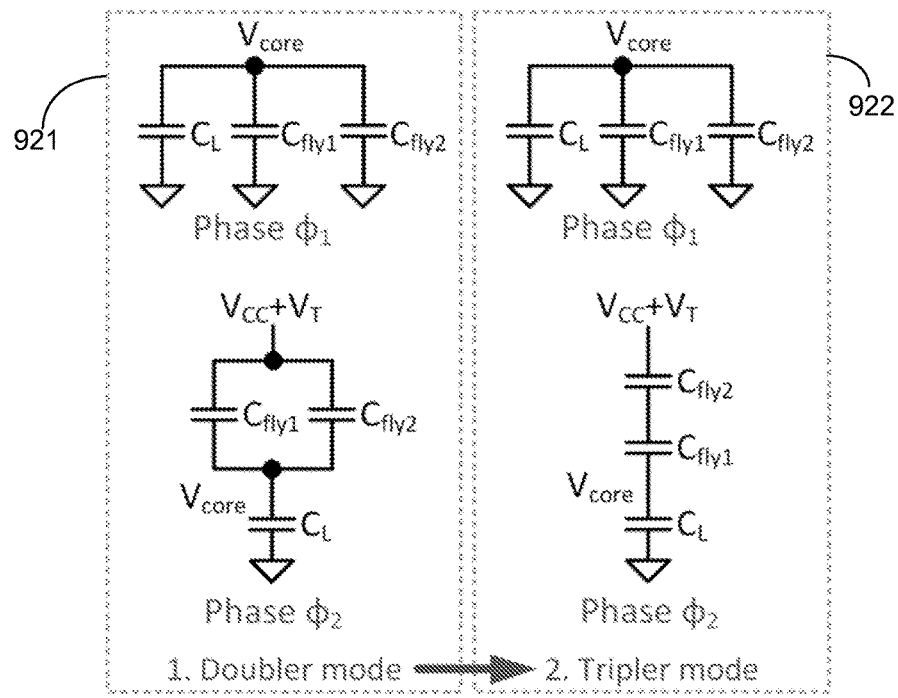
FIG. 9B illustrates capacitive models during first and second phases of the voltage doubler and voltage tripler of CRP of FIG. 9A, according to one embodiment of the disclosure.

FIG. 9B illustrates capacitive models 920 during first and second phases of the voltage doubler and voltage tripler of CRP of FIG. 9A, according to one embodiment of the disclosure. It is pointed out that those elements of FIG. 9B having the same reference numbers (or names) as the elements of any other figure can operate or function in any manner similar to that described, but are not limited to such.

In one embodiment, during voltage doubler mode, as illustrated by dotted box 921, capacitors $C_L$, $C_{fly1}$, and $C_{fly2}$ are coupled together differently for the first phase $\Phi_1$ and the second phase $\Phi_2$. In one embodiment, during the first phase $\Phi_1$, $C_L$, $C_{fly1}$, and $C_{fly2}$ are coupled together in parallel. During the second phase $\Phi_2$ $C_L$ is coupled in series with parallel coupled $C_{fly1}$, and $C_{fly2}$.

In one embodiment, during voltage tripler mode, as illustrated by dotted box 922, capacitors $C_L$, $C_{fly1}$, and $C_{fly2}$ are coupled together differently for the first phase $\Phi_1$ and the second phase $\Phi_2$. In one embodiment, during the first phase $\Phi_1$, $C_L$, $C_{fly1}$, and $C_{fly2}$ are coupled together in parallel. During the second phase $\Phi_2$, $C_L$, $Cf_{ly1}$, and $C_{fly2}$ are coupled together in series.

Referring back to FIG. 9A, as discussed above, the voltage doubler CRP 901 (or 501) stops working as soon as $V_{CC,core}$ approaches $V_{CC}/2$. To deplete $V_{CC,core}$ even more in order to recover more charge, a voltage tripler is used, where two flying capacitors $C_{fly1}$ and $C_{fly2}$ are coupled in series with $C_L$ to generate an open-circuit voltage as high as $3 \times V_{CC,core}$. In one embodiment, apparatus 900 is used and operated in two distinct, subsequent modes—first mode and second mode.

In one embodiment, in the first mode, apparatus 900 is operated in the doubler mode, where both capacitors $C_{fly1}$ and $C_{fly2}$ are constantly connected in parallel (throughout first and second phases $\Phi_1$ and $\Phi_2$ respectively) to initially recover charge from $V_{CC,core}$ as fast as with the voltage doubler circuit of FIG. 5A. In this embodiment, $C_{fly}$ of FIG. 5A is split into two parts such that $C_{fly}=C_{fly1}+C_{fly2}$.

In one embodiment, in the second mode, apparatus 900 is operated in the tripler mode. In this embodiment, $\Phi_{2dt}$ is used to couple the second terminal of $C_{fly2}$ to the first terminal of $C_{fly1}$ to form a series connection. In one embodiment, during the subsequent tripler mode, both capacitors $C_{fly1}$ and $C_{fly2}$ are still coupled in parallel to $C_L$ during the first phase $\Phi_1$. In one embodiment, during the second phase $\Phi_2$, all three capacitors are now coupled in series to generate three times the voltage boost in order to deliver charge to a power line $V_{CC,global}$ whose voltage is regulated at $V_{CC}$. In this embodiment, the charge delivered to $V_{CC,global}$ during each iteration becomes smaller than before not only because of always smaller voltage differences, but also due to the smaller value of the flying capacitors during the tripler mode (compared to the double mode). In one embodiment, it may be less critical to recover charge quickly during tripler mode due to the low leakage currents at low $V_{CC,core}$.

Figure 10:
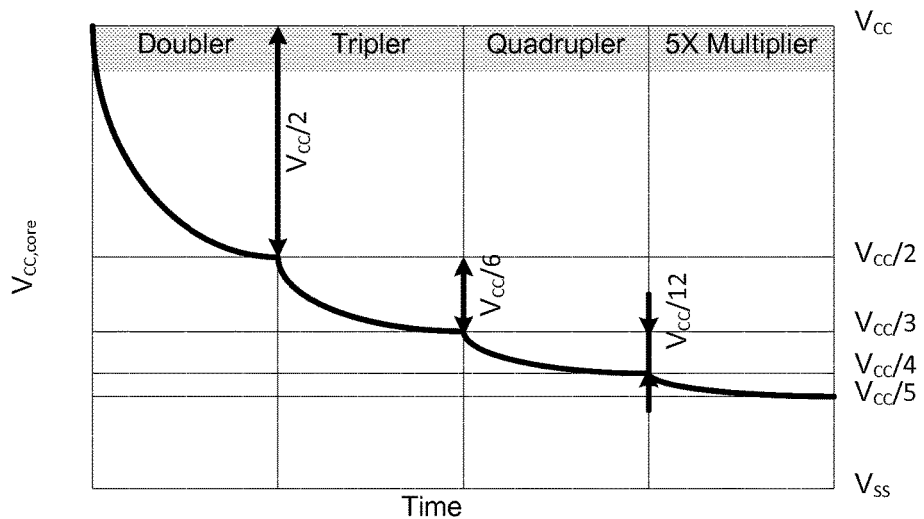
FIG. 10 illustrates a plot of $V_{CC,core}$ over time and time points when voltage doubler, tripler, quadrupler, etc., should be enabled and disabled to recover charge from $V_{CC,core}$ when it is discharging, according to one embodiment of the disclosure.

FIG. 10 illustrates a plot 1000 of $V_{CC,core}$ over time and time points when voltage doubler, tripler, quadrupler, etc., should be enabled and disabled to recover charge from $V_{CC,core}$ when it is discharging, according to one embodiment of the disclosure. It is pointed out that those elements of FIG. 10 having the same reference numbers (or names) as the elements of any other figure can operate or function in any manner similar to that described, but are not limited to such.

Here, x-axis is time and y-axis is voltage of $V_{CC,core}$. The y-axis runs from $V_{SS}$ to $V_{CC}$ and also shows the levels of $V_{CC}/2$, $V_{CC}/3$, $V_{CC}/4$, and $V_{CC}/5$. Plot 1000 also shows the time regions when: voltage doubler (Doubler), voltage tripler (Tripler), voltage quadrupler (Quadrupler), voltage 5× Multiplier (5× Multiplier) is activated and deactivated. Plot 1000 is explained with reference to FIG. 9A.

In one embodiment, voltage doubler of CRP 901 is enabled which operates till $V_{CC,core}$ is reduced by $V_{CC}/2$. When $V_{CC,core}$ reaches $V_{CC}/2$, ideally about 25% of charge is recovered from $V_{CC,core}$. In one embodiment, when $V_{CC,core}$ substantially reaches $V_{CC}/2$ level, voltage doubler of CRP 901 is disabled and voltage tripler is enabled (which uses 901 and 902). In one embodiment, voltage tripler recovers more charge from $V_{CC,core}$ and works till $V_{CC,core}$ level drops to $V_{CC}/3$ i.e., $V_{CC,core}$ drops by $V_{CC}/6$ from the point voltage doubler was disabled. Voltage tripler recovers about 31% of charge.

While the embodiments do not show a Quadrupler and 5× Multiplier, the concepts of voltage doubler and voltage tripler can be extended to realize Quadrupler and 5× Multiplier and other higher order voltage recovery circuits. In one embodiment, when $V_{CC,core}$ drops to $V_{CC}/3$ level, voltage tripler is turned OFF and Quadrupler is turned ON. In one embodiment, the Quadrupler recovers more charge from decaying $V_{CC,core}$ and operates till $V_{CC,core}$ drops to $V_{CC}/4$ level. At that point, the Quadrupler is turned OFF and 5× Multiplier is turned ON. Quadrupler recovers about 32.5% of the charge from $V_{CC,core}$, which is a small increment compared to charge recovered by the voltage tripler. In one embodiment, the 5× Multiplier further recovers charge from decaying $V_{CC,core}$ and works till $V_{CC,core}$ drops to $V_{CC}/5$ level. The 5× Multiplier recovers about 33.5% of charge from $V_{CC,core}$, which again is a small increment compared to the charge recovered by the Quadrupler and the voltage tripler. As shown by plot 1000, most of the charge is recovered by the voltage doubler followed by the voltage tripler, and then the amount of charge recovered drops over time. In one embodiment, the maximum theoretical recovery efficiency is about 35.5%.

Figure 11:
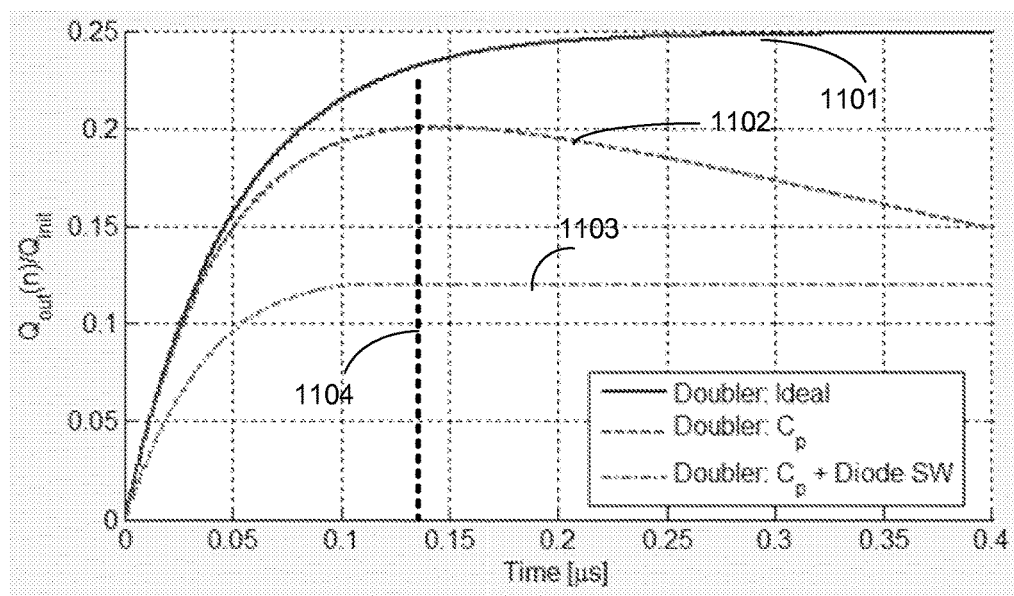
FIG. 11 illustrates a plot showing efficiency of ideal voltage doubler, realistic voltage doubler, and voltage doubler with diode switch, according to one embodiment of the disclosure.

FIG. 11 illustrates a plot 1100 showing efficiency of ideal voltage doubler, realistic voltage doubler, and voltage doubler with diode switch, according to one embodiment of the disclosure. It is pointed out that those elements of FIG. 11 having the same reference numbers (or names) as the elements of any other figure can operate or function in any manner similar to that described, but are not limited to such.

Here, x-axis is time (µs) and y-axis is CRP efficiency $\eta=Q_{out}/Q_{init}$. Waveform 1101 is the ideal voltage doubler efficiency which is 25%. Waveform 1102 is the efficiency of a realistic voltage doubler with parasitic capacitances and leakage impacts modeled. In this example, the efficiency of a realistic voltage doubler without diode switch peaks at 20% and then due to reverse current, the efficiency begins to fall. Waveform 1103 is the efficiency of a voltage doubler with diode switch MPd, and with parasitic capacitances and leakage impacts modeled. To avoid flow of reverse current, the diode switch MPd clamps the efficiency to about 12% mainly because of diode switch threshold $V_T$.

In one embodiment, bidirectional output switches between the CRP and $V_{CC,global}$ node lead to a higher charge recovery efficiency (as shown by waveform 1102), provided that the CRP is stopped at an optimum time (e.g., at marker 1104) before the reverse current becomes dominant. In one embodiment, self-stop circuits are used for detecting the optimum CRP stop time. In one embodiment, self-stop circuits are based on tracking the following quantities: voltage ($V_{CC,core}$), frequency of a ring oscillator supplied from $V_{CC,core}$, or CRP iteration count.

In one embodiment, voltage comparators are used to detect the time instant when $V_{CC,core}$ crosses the trip-points shown in Table 1, in order to stop the voltage-doubler and to enable the voltage-tripler, and in order to stop the voltage-tripler.

TABLE 1

Trip-points for enabling and/or disabling voltage doubler and voltage tripler

| | Voltage Doubler | Voltage Tripler |
| --- | --- | --- |
| Bidirectional Output switch (e.g., wire) | $V_{CC}/2$ | $V_{CC}/3$ |
| Unidirectional output switch (e.g., diode MPd1 and MPd2) | $(V_{CC} + V_T)/2$ | $(V_{CC} + V_T)/3$ |

Figure 12:
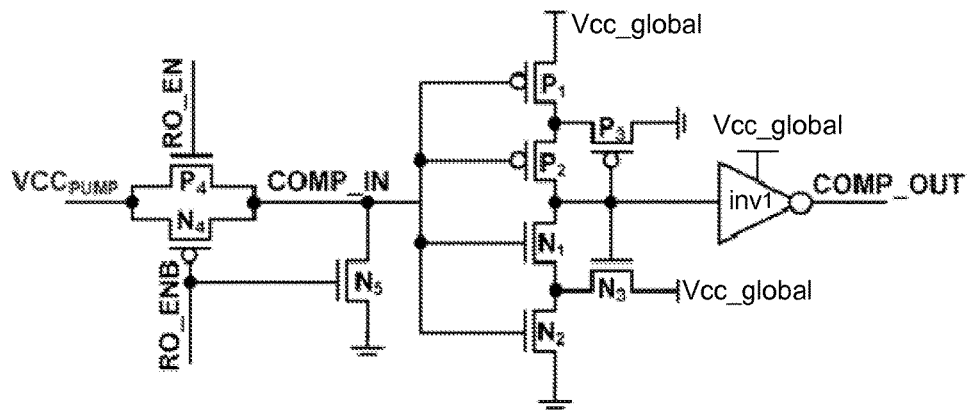
FIG. 12 is an inverter based self-stop sense circuit disabling a voltage doubler and/or tripler of the CRP, according to one embodiment of the disclosure.

FIG. 12 is an inverter based self-stop sense circuit 1200 disabling a voltage doubler and/or tripler of the CRP, according to one embodiment of the disclosure. It is pointed out that those elements of FIG. 12 having the same reference numbers (or names) as the elements of any other figure can operate or function in any manner similar to that described, but are not limited to such.

In one embodiment, self-stop sense circuit 1200 comprises p-type transistors P1, P2, P3, and P4; n-type transistors N1, N2, N3, and N4; and inverter inv1. In one embodiment, P1 is coupled in series with P2, where the source terminal of P1 is coupled to the ungated power supply ($V_{cc\_global}$) In one embodiment, N1 is coupled in series with N2, where the source terminal of N2 is coupled to ground. In one embodiment, P3 forms a feedback path such that the gate terminal of P3 is coupled to the drain terminals of P2 and N1, and the source terminal of P3 is coupled to the drain terminal of P1 and the source terminal of P2, and the drain terminal of P3 is coupled to ground. In one embodiment, N3 forms a feedback path such that the gate terminal of N3 is coupled to the drain terminals of P2 and N1, and the drain terminal of N3 is coupled to the source terminal of N1 and the drain terminal of N2, and the source terminal of N3 is coupled to supply ($V_{cc\_global}$).

In one embodiment, the gate terminals of P3, N3, and the drain terminals of P2 and N1 are coupled to input of inverter inv1. In one embodiment, output of inverter inv is COMP_OUT. In one embodiment, gate terminals of P1, P2, N1, and N2 are coupled to COMP_IN. In one embodiment, P4 and N4 form a transmission gate (TG) such that gate terminal of P4 is controllable by RO_EN (ring oscillator enable signal), and gate terminal of N4 is controllable by RO_ENB (which is an inverse of RO_EN). In one embodiment, TG receives $VCC_{PUMP}$ (i.e., $V_{CC,core}$) and outputs COMP_IN. Here, labels for nodes and signals are interchangeably used. For example, COMP_IN is used to describe node COMP_IN or signal COMP_IN depending on the context of the sentence. In one embodiment, N5 is coupled to COMP_IN and controllable by RO_ENB.

In one embodiment, the trip-point of circuit 1200 is engineered to the desired value, according to Table 1, by transistor sizing. In one embodiment, hysteresis is added to the voltage transfer characteristic to avoid uncontrolled and repeated enabling and disabling of the CRP in the occurrence of a slowly varying $V_{CC,core}$ containing potentially some ripple and other noise. In one embodiment, in order to avoid excessive short-circuit currents in circuit 1200, $V_{CC,core}$ is sampled and applied to the input of the circuit 1200 periodically for a short amount of time. In one embodiment, the corresponding TG is controlled by a pulse (i.e., RO_EN and RO_ENB) derived from the clock phases of a ring oscillator. In one embodiment, trip point of circuit 1200 is adjusted by sizing P3 and N3. In one embodiment, sizes for P3 and N3 are controllable by fuse signal.

Figure 13:
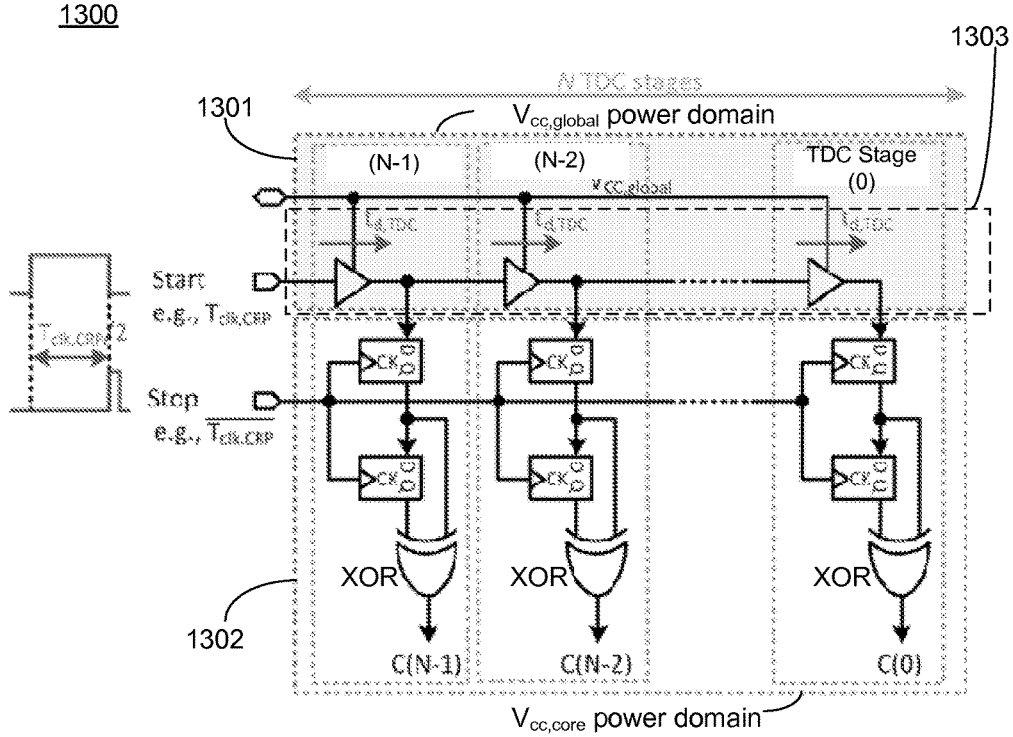
FIG. 13 is a Time-to-Digital converter (TDC) self-stop sense circuit for disabling a voltage doubler and/or tripler of the CRP, according to one embodiment of the disclosure.

FIG. 13 is Time-to-Digital converter (TDC) self-stop sense circuit 1300 for disabling a voltage doubler and/or tripler of the CRP, according to one embodiment of the disclosure. It is pointed out that those elements of FIG. 13 having the same reference numbers (or names) as the elements of any other figure can operate or function in any manner similar to that described, but are not limited to such.

An alternative (or additional) approach to detecting the optimum CRP stop time is to monitor the change in the frequency of a ring oscillator. As shown in FIG. 2B, $V_{CC,core}$ initially drops quickly, and is depleted at a lower rate during later CRP iterations. This rate of voltage change results in a rate of frequency change of the ring oscillator. In one embodiment, as soon as the frequency changes, from iteration to iteration, falls below a certain threshold, the CRP can be stopped (or the tripler part can be enabled).

Referring back to FIG. 13, in one embodiment, TDC comprises N stages—0 to (N−1), where 'N' is an integer. In one embodiment, part of the TDC stage operates on $V_{CC,global}$ power domain 1301 and part of it operates on $V_{CC,core}$ power domain 1302. In one embodiment, each TDC stage includes two flip-flops, XOR gate, and a buffer. In one embodiment, the buffer in each stage forms a delay line 1303. In one embodiment, output of each delay cell of delay line 1303 is received as input data to a first flip-flop of a TDC state. In one embodiment, output of the first flip-flop is received as data by the second flip-flop of that TDC state. In one embodiment, the delay cells of delay line 1303 are supplied from $V_{CC,global}$ and exhibit a constant propagation delay $t_{d\text{-}TDC}$.

In one embodiment, the first phase of the ring oscillator (not shown here) is used as start signal of the TDC and propagates along delay line 1303. In one embodiment, a pulse derived from a small number of delayed clock phases of the ring oscillator serves as a TDC stop signal and captures the state of delay line 1303 after half a clock period. In one embodiment, for the lowest targeted $V_{CC,core}$ of $V_{CC}/3$, the design of the delay line is to satisfy $N \times t_{d,TDC} > T_{clk,CRP}/2$, where 'N' denotes the number of delay stages of the TDC, and $T_{clk,LCRP}$ denotes the frequency of the CRP ring oscillator (an embodiment of which is shown in FIG. 16A).

Referring back to FIG. 13, in one embodiment, to detect a change in the duration of $T_{clk,CRP}/2$, the stop pulse not only captures the current state of the delay line, but also transfers the previous state to the second flip-flop bank. In one embodiment, the current and the previous state of delay line 1303 are compared (using XOR gates) in order to detect a minimum frequency change below which the CRP is stopped (or switched to the tripler mode).

In one embodiment, depending on the $C_L/C_{fly}$ ratio, and for a worst process-temperature-voltage (PVT) corner, a minimum number of CRP iterations can be defined. In one embodiment, to reduce power overhead arising from the self-stop circuit 1300, the flip-flop banks (i.e., first and second flip-flops in each TDC stage) can be reconfigured as a counter during the early iterations to perform the minimum number of iterations required under all predicted PVT conditions. In one embodiment, TDC is enabled after completing the minimum number of iterations, in order to find the optimum CRP stop time for each manufactured chip under the current voltage and temperature conditions.

Figure 14:
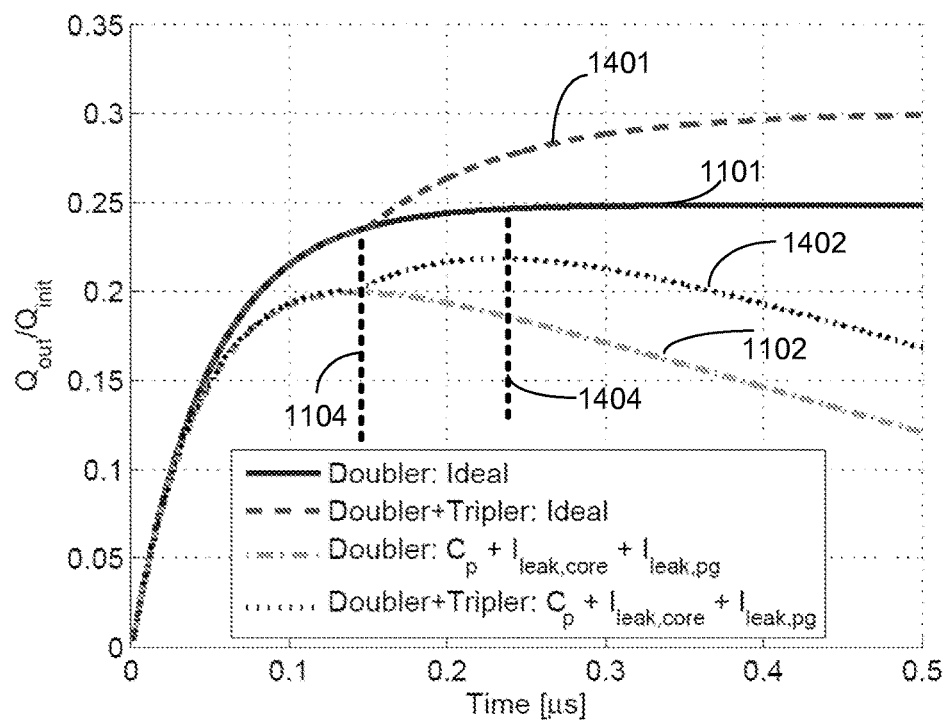
FIG. 14 illustrates a plot showing efficiency of ideal voltage doubler, ideal voltage doubler and tripler combined, realistic voltage doubler, and realistic voltage doubler and tripler combined without diode switch, according to one embodiment of the disclosure.

FIG. 14 illustrates a plot 1400 showing efficiency of ideal voltage doubler, ideal voltage doubler and tripler combined, realistic voltage doubler, and realistic voltage doubler and tripler combined without diode switch, according to one embodiment of the disclosure. It is pointed out that those elements of FIG. 14 having the same reference numbers (or names) as the elements of any other figure can operate or function in any manner similar to that described, but are not limited to such.

Here, x-axis is time (μs) and y-axis is CRP efficiency $\eta = Q_{out}/Q_{init}$. Waveform 1101 (from FIG. 11) is the ideal voltage doubler efficiency which is 25%. Waveform 1102 (from FIG. 11) is the efficiency of a realistic voltage doubler with parasitic capacitances and leakage impacts modeled. Realistic voltage doubler includes non-idealities such as parasitic capacitances, on-resistance of switches, core leakage currents, power-gate (or sleep transistor) leakage currents, etc. In this example, the efficiency of a realistic voltage doubler without diode switch peaks at 20% and then due to reverse current, the efficiency begins to fall. Waveform 1401 is the ideal voltage doubler and tripler combined efficiency, without diode switches, which is about 30%. Waveform 1402 is the efficiency of a realistic voltage doubler and tripler combined with parasitic capacitances and leakage impacts modeled, and without diode switches.

In the ideal cases 1101 and 1401, the voltage doubler and the doubler and tripler combined circuits can recover 25% and 31% of the initial charge stored on $C_L$ respectively. Parasitic capacitances and core leakage currents lead to slightly degraded efficiencies of approximately 20% and 22.5% for the voltage doubler and doubler and tripler combined circuit, respectively. One loss mechanism arising from parasitic capacitances is charging of $C_{fly,P2}$ from $C_L$ and subsequently discharging it to $V_{SS}$.

In one embodiment, self-stop circuits (such as those discussed with reference to FIG. 12 and FIG. 13) are used for detecting the optimum CRP stop time which is usually before the roll-off of waveforms 1102 and 1402. Waveforms 1102 and 1402 indicate that voltage doubler can be turned OFF around the 1104 mark and at that time the voltage tripler can be turned ON. Waveforms 1102 and 1402 also indicate that the voltage tripler can be turned OFF at 1404 mark to achieve an optimum CRP efficiency.

Figure 15:
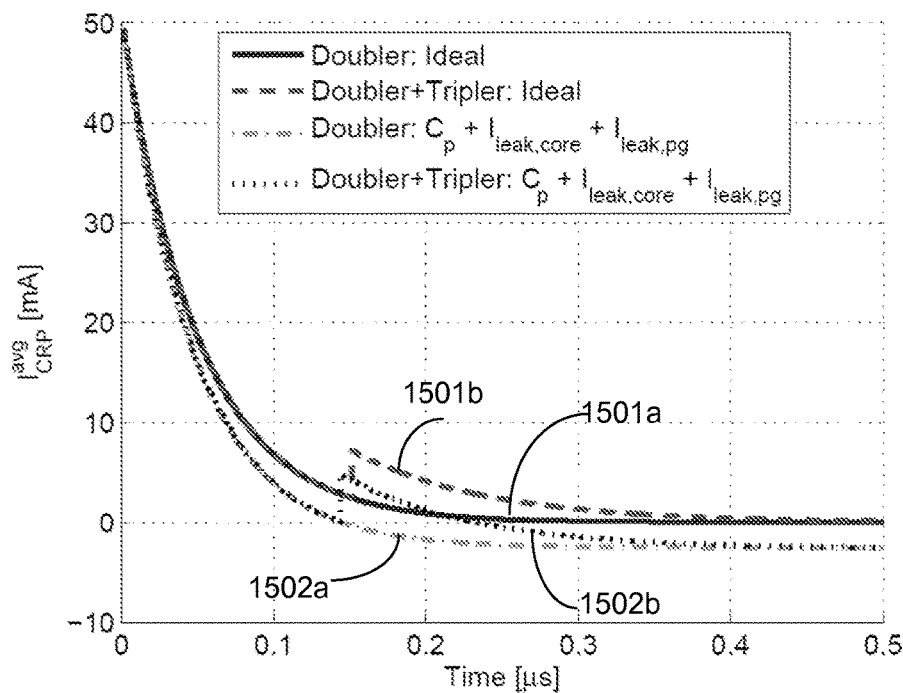
FIG. 15 illustrates a plot showing average CRP current of ideal voltage doubler, ideal voltage doubler and tripler combined, realistic voltage doubler, and realistic voltage doubler and tripler combined without diode switch, according to one embodiment of the disclosure.

FIG. 15 illustrates a plot 1500 showing average CRP current of an ideal voltage doubler, ideal voltage doubler and tripler combined, realistic voltage doubler, and realistic voltage doubler and tripler combined without diode switch, according to one embodiment of the disclosure. It is pointed out that those elements of FIG. 15 having the same reference numbers (or names) as the elements of any other figure can operate or function in any manner similar to that described, but are not limited to such.

Here, x-axis is time (μs) and y-axis is CRP average current $I^{avg}$ in mA. Plot 1500 shows four waveforms 1501a, 1501b, 1502a, and 1502b. Waveform 1501a is the current of an ideal voltage doubler (i.e., without parasitic and leakage currents). As time progresses, $I^{avg}$ reduces because CRP can no longer recover more charge (hence current) from $V_{CC,core}$ and supply it to $V_{CC,global}$. Waveform 1501b is the current of ideal voltage doubler and tripler combined (i.e., without parasitic and leakage currents). As time progresses, $I^{avg}$ reduces and then kicks up around 0.15 μs (in this example) when the voltage doubler is turned OFF and the voltage tripler is enabled. After the voltage tripler turns OFF, current continues to reduce to zero because the CRP can no longer recover more charge (hence current) from $V_{CC,core}$ and supply that recovered charge to $V_{CC,global}$.

Waveform 1502a is the current of realistic voltage doubler. Realistic voltage double includes non-idealities such as parasitic capacitances, on-resistance of switches, core leakage currents, power-gate (or sleep transistor) leakage currents, etc. Waveform 1502b is the current of realistic voltage doubler and tripler combined. The difference between waveforms 1502a and 1501a, and waveforms 1502b and 1501b is that current continues to reduce below zero instead of decaying to zero because of leakage currents.

Plot 1500 shows the average CRP output current per iteration, $I_{CRP}^{avg}$, as a function of time. In the ideal cases of waveform 1501a and 1501b, the CRP output current becomes zero after a large number of iterations. For waveforms 1502a and 1502b, due to the impact of parasitic capacitances and leakage currents depleting $V_{CC,core}$ below the point where the CRP can still work, a negative, reverse current starts to flow from $V_{CC,global}$ inside the CRP if the CRP is not stopped at the right time. In the exemplary waveforms, while the voltage doubler has a single current peak, the doubler combined with tripler circuit exhibit a second current peak as soon as the tripler part is enabled.

FIG. 16A illustrates an apparatus 1600 with a multi-phase multi-stage voltage doubler based CRP, according to one embodiment of the disclosure. It is pointed out that those elements of FIG. 16A having the same reference numbers (or names) as the elements of any other figure can operate or function in any manner similar to that described, but are not limited to such.

In one embodiment, apparatus 1600 comprises sleep transistors $PG_1$ and $PG_2$, cores Core-1 and Core-2, p-type switches $MP1_A$ and $MP1_B$, and multi-phase CRP 1601. In one embodiment, $PG_1$ is controllable by Sleep-1 and $PG_2$ is controllable by Sleep-2 signals. In one embodiment, $MP1_A$ is coupled to Vir-Vcc$_1$ and VCC$_{PUMP}$ nodes as shown. In one embodiment, $MP1_B$ is coupled to Vir-Vcc$_2$ and $V_{OUTPUMP}$ nodes as shown. In one embodiment, when $MP1_A$ is turned ON by OUT_EN-1, CRP 1601 begins to recover charge from Vir-Vcc$_1$ (same as $V_{CC,core}$ in other embodiments). In one embodiment, when $MP1_B$ is turned ON by IN_EN-2, CRP 1601 begins to transfer the recovered charge from VOUT$_{PUMP}$ to Vir-Vcc$_2$.

In one embodiment, CRP 1601 comprises a plurality of pump stages 1602-1 to 1602-N, where 'N' is an integer; ring oscillator (Ring Osc) 1603 part of which is embedded in each of the pump stages; self-stop circuit 1604, NAND gate NAND1; and inverter inv1. In one embodiment, each pump stage adds a small portion of the recovered charge to VOUT$_{PUMP}$ over multiple phases and iterations to avoid overshoot on Vout$_{PUMP}$ hence $V_{CC,global}$. In one embodiment, each pump behaves like a phase in a multi-phase voltage generator.

In one embodiment, ring oscillator 1603 comprises a plurality of inverters (or delay cells) in a chain. In one embodiment, ground path to each of the inverter of the plurality of inverters is gated by an n-type device. In one embodiment, source terminal of that n-type device is coupled to ground and drain terminal of the n-type device is coupled to the inverter. In one embodiment, drain terminals of the n-type devices are shorted with one another to provide a virtual ground Vg. In one embodiment, the plurality of inverters is powered by VCC$_{PUMP}$. In one embodiment, a first decoupling capacitor $C_{PUMP\_IN}$ is coupled to VCC$_{PUMP}$ and ground. In one embodiment, second decoupling capacitor $C_{PUMP\_OUT}$ is coupled to VOUT$_{PUMP}$ and ground.

In one embodiment, a NAND gate NAND2 is used to drive the first inverter of the plurality of inverters. In one embodiment, NAND2 is used to disable the toggling of the outputs of the plurality of inverters. In one embodiment, NAND2 receives input RO_EN and output of the last inverter in the plurality of inverters.

In this embodiment, NAND1 gate is used to stop the clock signal, as well as NMOS footer devices in all pump stages, to reduce leakage currents after charge recovery. In one embodiment, most circuits of the CRP are supplied by $V_{CC,core}$ to avoid draining current from the global power line $V_{CC,global}$. In such an embodiment, the operating frequency of CRP 1601 decreases with decreasing $V_{CC,core}$. In one embodiment, circuits requiring a stable supply voltage, such as the voltage comparator 1604, are supplied from the regulated $V_{CC,global}$. In one embodiment, output of each inverter of the plurality of inverters drives a terminal of the flying capacitor.

In one embodiment, self-stop circuit 1604 (e.g., circuits 1200 and 1300) receives VCC$_{PUMP}$ and generates a COMP_OUT signal which is used to stop the voltage doubler i.e., to disable ring oscillator 1603 and thus stop the CRP's normal operation. For example, self-stop circuit 1604 implemented as a voltage comparator can be used to sense $V_{CC,core}$ and stop the voltage-doubler CRP (or enable a voltage-tripler CRP extension, as discussed in some embodiments) as soon as $V_{CC,core}$ is ramped down to a value close to $V_{CC}/2$.

In one embodiment, to reduce the output current peak from CRP 1601 and the associated voltage disturb in the load system, the flying capacitor is split into many parts and distributed across several pump stages. FIG. 16B illustrates an apparatus 1620 with one of the stages of the multi-phase multi-stage voltage doubler based CRP of FIG. 16A, according to one embodiment of the disclosure. It is pointed out that those elements of FIG. 16B having the same reference numbers (or names) as the elements of any other figure can operate or function in any manner similar to that described, but are not limited to such.

The waveforms of plot 1620 are generated with the assumption that the CRP is never stopped in order to illustrate the low severity of a slightly inaccurate, non-optimum stop time. The charge recovery efficiency η curves are rather flat around their maximum value, such that a small stop time inaccuracy results only in a slight degradation of η, according to one embodiment.

In one embodiment, each CRP pump stage (e.g., 1620) comprises two cross-coupled halves which are in complementary phases. In one embodiment, the devices in the cross-coupled halves comprise MP1, MP2, MN1, and MN2. In one embodiment, source terminals of MP1 and MP2 are coupled to $V_{CC\text{-}OUT}$. In one embodiment, gate terminal of MP2 is coupled to a first terminal of the flying capacitor $C_{flyA}$ and the drain terminal of MP1. In one embodiment, the gate terminal of MP1 is coupled to a first terminal of flying capacitor $C_{flyB}$ and the drain terminal of MP2. In one embodiment, the source terminal of MN1 is coupled to the first terminal of $C_{flyA}$. In one embodiment, the gate terminal of MN1 is coupled to the first terminal of $C_{flyB}$. In one embodiment, the drain terminals of MN1 and MN2 are coupled to $V_{CC\text{-}IN}$ (same as $VCC_{PUMP}$). In one embodiment, the first and second phases ($\Phi_1$ and $\Phi_2$) are generated by the inverters of ring oscillator 1603. For example, inverter i1 generates the first phase $\Phi 1$ and inverter i2 generates the second phase $\Phi_2$. In one embodiment, inverters i1 and i2 are disabled by the gated output of NAND2, and from n-type transistors MNe1 and MNe2 which are controlled by RO_EN signal.

In one embodiment, if the left half (i.e., MP1, MN1, and $C_{flyA}$) is in first phase $\Phi_1$, the right half (i.e., MP2, MN2, and $C_{flyB}$) is in second phase $\Phi_2$, and vice-versa. This allows the local generation of the boosted (i.e., to levels above $V_{CC}$) switch control signals. In one embodiment, one half generates a boosted voltage at the top plate (i.e., first terminal) of the flying capacitor during the second phase $\Phi_2$, which can be used by the other half to properly turn OFF the PMOS output switch (MP1 or MP2) while turning ON the NMOS input switch (MN1 or MN2) to charge the flying capacitor from $C_L$ during the first phase $\Phi_1$.

In one embodiment, the switches controlling at the bottom plate (i.e., the second terminal) of the flying capacitors are implemented as inverters, which in turn form ring oscillator 1603 by cascading several pump stages. In such an embodiment, a low-overhead solution is achieved to generate the various clock phases for the multi-stage, multi-phase voltage-doubler CRP 1601. The efficiency of various embodiments of power gating schemes with charge recovery can be evaluated by applying it to three benchmark microprocessor SoCs, as shown in Table 2, assuming a small, medium-size, and large computational core to be power-gated.

TABLE 2

Application examples of power gating with charge recovery, using the voltage doubler CRP with unidirectional output switches

| Gated core | unit size | | |
|---|---|---|---|
| | Small | Medium | Large |
| Core cap $C_L$ | 2 nF | 10 nF | 50 nF |
| GE, PG | $2 \times 10^6$, 12.5% | $1 \times 10^7$, 12.5% | $5 \times 10^7$, 12.5% |
| $t_{min}$ (reduction) | 250 ns (−12.5%) | 250 ns (−12.5%) | 250 ns (−12.5%) |
| $t_{max}$ ($Q_{out}$ negligible) | 3.85 μs | 3.85 μs | 3.85 μs |
| Flying cap $C_{fly}$ | 10 pF | 10 pF | 10 pF |
| $T = C_L/C_{fly}$ | 200 | 1000 | 5000 |
| η = $Q_{out}/Q_{init}$ (ideal, bidirectional output switches) | 25.0% | 25.0% | 25.0% |
| η (Diode + $C_p$) | 12.0% | 12.2% | 12.2% |
| η (Sim. MIM cap) | 10.6% | 10.6% | 10.6% |
| η (Sim. MOSCAP) | 7.79% | 7.79% | 7.76% |
| $t_{recovery}$ (Sim. MOSCAP-Model) | 144-164 ns | 716-821 ns | 3.6-4.1 μs |

For the numeric examples presented in Table 2, the embodiments of power gating scheme with charge recovery are beneficial and highly significant for sleep times ranging from 250 ns to 3.85 μs, for example. For longer sleep times (e.g., greater than 3.85 μs), using the CRP may not result in any drawback (other than the small area overhead). In one embodiment, the energy savings arising from the CRP become negligible compared to the leakage current of the power-gated core.

For shorter periods of inactivity (e.g., less than 250 ns), power-gating with charge recovery may be avoided as it would result in a higher energy cost (to ramp up $C_L$ when entering the active mode again) than the one arising from the leakage current of the un-gated core. Compared to conventional power-gating without charge recovery, the charge recovery scheme of the embodiments may leads to a 12.5% reduction in the minimum sleep time requirement for net energy savings.

Table 2 also shows that, for the CRP topology, for example, a voltage doubler with unidirectional diode-connected output switches, the modeled efficiency η is around 12% (accounting for $V_T$=300 mV and parasitic capacitances). Transistor-level circuit simulations assuming that the flying capacitors are implemented as MIM (metal-insulator-metal) capacitors show a fairly well corresponding efficiency of around 11%. Using MOSCAPs as flying capacitors may degrade the efficiency to around 8%.

The total charge recovery time, corresponding to the $V_{CC,core}$ ramp-down time, depends on the T=$C_L/C_{fly}$ ratio, and varies e.g., from around 200 ns to 4 μs for T=200 and T=5000, respectively. Using voltage doubler CRP with bidirectional output switches, MIM capacitors, and accurate self-stop circuits, transistor-level circuit simulations may reveal a charge recovery efficiency of around 20%.

Figure 17:
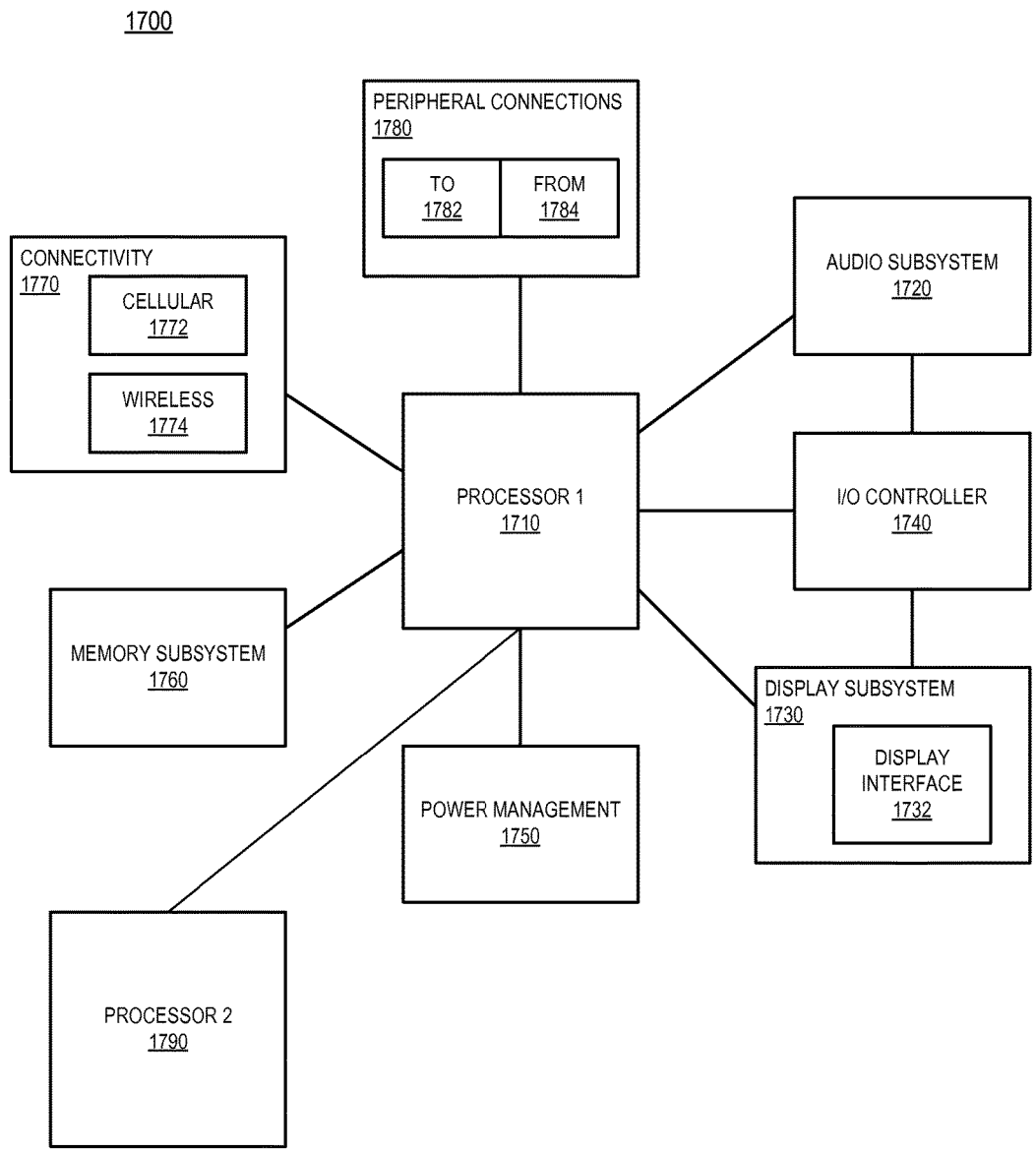
FIG. 17 is a smart device or a computer system or an SoC (system-on-chip) with power-gating scheme having CRP, according to one embodiment of the disclosure.

FIG. 17 is a smart device or a computer system or an SoC (System-on-Chip) with power-gating scheme having CRP, according to one embodiment of the disclosure. It is pointed out that those elements of FIG. 17 having the same reference numbers (or names) as the elements of any other figure can operate or function in any manner similar to that described, but are not limited to such.

FIG. 17 illustrates a block diagram of an embodiment of a mobile device in which flat surface interface connectors could be used. In one embodiment, computing device 1700 represents a mobile computing device, such as a computing tablet, a mobile phone or smart-phone, a wireless-enabled e-reader, or other wireless mobile device. It will be understood that certain components are shown generally, and not all components of such a device are shown in computing device 1700.

In one embodiment, computing device 1700 includes a first processor 1710 with power-gating scheme having CRP described with reference to embodiments discussed. Other blocks of the computing device 1700 may also include power-gating scheme having CRP described with reference to embodiments discussed. The various embodiments of the present disclosure may also comprise a network interface within 1770 such as a wireless interface so that a system embodiment may be incorporated into a wireless device, for example, cell phone or personal digital assistant.

In one embodiment, processor 1710 (and processor 1790) can include one or more physical devices, such as microprocessors, application processors, microcontrollers, programmable logic devices, or other processing means. The processing operations performed by processor 1710 include the execution of an operating platform or operating system on which applications and/or device functions are executed. The processing operations include operations related to I/O (input/output) with a human user or with other devices, operations related to power management, and/or operations related to connecting the computing device 1700 to another device. The processing operations may also include operations related to audio I/O and/or display I/O.

In one embodiment, computing device 1700 includes audio subsystem 1720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1700, or connected to the computing device 1700. In one embodiment, a user interacts with the computing device 1700 by providing audio commands that are received and processed by processor 1710.

Display subsystem 1730 represents hardware (e.g., display devices) and software (e.g., drivers) components that provide a visual and/or tactile display for a user to interact with the computing device 1700. Display subsystem 1730 includes display interface 1732, which includes the particular screen or hardware device used to provide a display to a user. In one embodiment, display interface 1732 includes logic separate from processor 1710 to perform at least some processing related to the display. In one embodiment, display subsystem 1730 includes a touch screen (or touch pad) device that provides both output and input to a user.

I/O controller 1740 represents hardware devices and software components related to interaction with a user. I/O controller 1740 is operable to manage hardware that is part of audio subsystem 1720 and/or display subsystem 1730. Additionally, I/O controller 1740 illustrates a connection point for additional devices that connect to computing device 1700 through which a user might interact with the system. For example, devices that can be attached to the computing device 1700 might include microphone devices, speaker or stereo systems, video systems or other display devices, keyboard or keypad devices, or other I/O devices for use with specific applications such as card readers or other devices.

As mentioned above, I/O controller 1740 can interact with audio subsystem 1720 and/or display subsystem 1730. For example, input through a microphone or other audio device can provide input or commands for one or more applications or functions of the computing device 1700. Additionally, audio output can be provided instead of, or in addition to display output. In another example, if display subsystem 1730 includes a touch screen, the display device also acts as an input device, which can be at least partially managed by I/O controller 1740. There can also be additional buttons or switches on the computing device 1700 to provide I/O functions managed by I/O controller 1740.

In one embodiment, I/O controller 1740 manages devices such as accelerometers, cameras, light sensors or other environmental sensors, or other hardware that can be included in the computing device 1700. The input can be part of direct user interaction, as well as providing environmental input to the system to influence its operations (such as filtering for noise, adjusting displays for brightness detection, applying a flash for a camera, or other features).

In one embodiment, computing device 1700 includes power management 1750 that manages battery power usage, charging of the battery, and features related to power saving operation. Memory subsystem 1760 includes memory devices for storing information in computing device 1700. Memory can include nonvolatile (state does not change if power to the memory device is interrupted) and/or volatile (state is indeterminate if power to the memory device is interrupted) memory devices. Memory subsystem 1760 can store application data, user data, music, photos, documents, or other data, as well as system data (whether long-term or temporary) related to the execution of the applications and functions of the computing device 1700.

Elements of embodiments are also provided as a machine-readable medium (e.g., memory 1760) for storing the computer-executable instructions (e.g., instructions to implement any other processes discussed herein). The machine-readable medium (e.g., memory 1760) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1770 includes hardware devices (e.g., wireless and/or wired connectors and communication hardware) and software components (e.g., drivers, protocol stacks) to enable the computing device 1700 to communicate with external devices. The computing device 1700 could be separate devices, such as other computing devices, wireless access points or base stations, as well as peripherals such as headsets, printers, or other devices.

Connectivity 1770 can include multiple different types of connectivity. To generalize, the computing device 1700 is illustrated with cellular connectivity 1772 and wireless connectivity 1774. Cellular connectivity 1772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1774 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1780 include hardware interfaces and connectors, as well as software components (e.g., drivers, protocol stacks) to make peripheral connections. It will be understood that the computing device 1700 could both be a peripheral device ("to" 1782) to other computing devices, as well as have peripheral devices ("from" 1784) connected to it. The computing device 1700 commonly has a "docking" connector to connect to other computing devices for purposes such as managing (e.g., downloading and/or uploading, changing, synchronizing) content on computing device 1700. Additionally, a docking connector can allow computing device 1700 to connect to certain peripherals that allow the computing device 1700 to control content output, for example, to audiovisual or other systems.

In addition to a proprietary docking connector or other proprietary connection hardware, the computing device 1700 can make peripheral connections 1780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first power supply node; a second power supply node; a controllable device coupled to the first power supply node and to the second power supply node, the controllable device operable to short the first power supply node to the second power supply node; a load coupled to the second power supply node; and a charge recovery pump (CRP) coupled to the first and second power supply nodes.

In one embodiment, the CRP is operable to turn on when the controllable device is turned off. In one embodiment, the CRP is operable to recover charge from a load capacitance associated to the load and to provide it to the first power supply node. In one embodiment, in the CRP comprises a voltage doubler. In one embodiment, the CRP comprises a disabling circuit to disable the voltage doubler after a predetermined time. In one embodiment, the disabling circuit comprises a Schmitt Trigger device. In one embodiment, the disabling circuit comprises a Time-to-Delay (TDC) converter.

In one embodiment, the CRP comprises a combination of a voltage doubler and a voltage tripler. In one embodiment, the CRP comprises: a first disabling circuit to disable the voltage doubler and to enable the voltage tripler after a first predetermined time; and a second disabling circuit to disable to the voltage tripler after a second predetermined time.

In one embodiment, the load is processor, processor core, or a group of logic units. In one embodiment, the CRP is shared with multiple different loads including the load. In one embodiment, the apparatus further comprises logic to recover charge from one or more of the multiple different loads which is in sleep mode, and to provide the recovered charge to another load which is active. In one embodiment, the apparatus further comprises a diode connected device coupled to the CRP and the first power supply node. In one embodiment, the CRP is directly coupled to the first power supply node. In one embodiment, the controllable device is a sleep transistor controllable by a sleep signal. In one embodiment, the CRP includes a capacitor which is shared with a decoupling capacitor.

In another example, an apparatus is provided which comprises: a first power supply node; a second power supply node; a plurality of voltage doublers, each of which is coupled to the first and second power supply nodes; and a ring oscillator to provide a plurality of phases, each of which is coupled to a capacitor of each voltage doubler. In one embodiment, the ring oscillator is coupled to the second power supply node. In one embodiment, each of the voltage doubler includes a first capacitor to share charge with a load capacitor coupled to the second power supply. In one embodiment, each of the voltage doubler includes a second capacitor to provide charge to the first power supply node. In one embodiment, each of the voltage doubler to provide charge to the first power supply node at a different time.

In one embodiment, the apparatus further a comparator to compare power supply level on the second power supply node to a threshold level, and to output a control signal for enabling or disabling the ring oscillator. In one embodiment, the ring oscillator is coupled to a logic to disable current path to the ring oscillator. In one embodiment, the apparatus further comprises a plurality of voltage triplers each of which is coupled to the first and second power supply nodes.

In one embodiment, the apparatus further comprises: a first disabling circuit to disable a voltage doubler from the plurality of voltage doublers, and to enable a voltage tripler from a plurality of voltage triplers after a first predetermined time; and a second disabling circuit to disable to the voltage tripler after a second predetermined time.

In another example, an apparatus is provided which comprises: a power supply node; a plurality of processor cores; a plurality of sleep transistors coupled to the first power supply node, each of the sleep transistors is coupled to a processor core of the plurality of processor cores, wherein each of the processor core has an internal power supply node coupled to the sleep transistor; and a plurality of charge recovery pumps (CRPs), each of which is coupled to a processor core and the power supply node.

In one embodiment, each of the CRP is operable to turn on when a sleep transistor coupled to that CRP is turned off. In one embodiment, each of the CRP is operable to recover charge from the internal power supply node and to provide the recovered charge to the power supply node. In one embodiment, wherein each of the CRP comprises a voltage doubler. In one embodiment, each of the CRP comprises a disabling circuit to disable the voltage doubler after a predetermined time. In one embodiment, the disabling circuit comprises a Schmitt Trigger device.

In one embodiment, the disabling circuit comprises a Time-to-Delay (TDC) converter. In one embodiment, each of the CRP comprises a combination of a voltage doubler and a voltage tripler. In one embodiment, each of the CRP comprises: a first disabling circuit to disable the voltage doubler and to enable the voltage tripler after a first predetermined time; and a second disabling circuit to disable to the voltage tripler after a second predetermined time.

In another example, a system is provided which comprises: a memory unit; a processor coupled to the memory unit, the processor having an apparatus according the apparatus discussed above; and a wireless interface for allowing the processor to communicate with another device. In one embodiment, the system further comprises a display unit. In one embodiment, the display unit is a touch screen.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first power supply node;
a second power supply node;
a controllable device coupled to the first power supply node and to the second power supply node, the controllable device operable to short the first power supply node to the second power supply node;
a load coupled to the second power supply node; and
a charge recovery pump (CRP) coupled to the first power supply node and the second power supply node, the CRP comprising a first switch, a second switch and a capacitor coupled to the first switch and the second switch, wherein the first switch is operable to couple the capacitor in parallel to the load during a first phase of a signal, and the second switch is operable to couple the capacitor in series to the load during a second phase of the signal.

2. The apparatus of claim 1, wherein the CRP is operable to turn on when the controllable device is turned off.

3. The apparatus of claim 1, wherein the first switch is operable to couple the capacitor in parallel to the load to recover a charge from a load capacitance associated to the load and wherein the second switch is operable to couple the capacitor in series with the load to provide the recovered charge to the first power supply node.

4. The apparatus of claim 1, where in the CRP comprises a voltage doubler.

5. The apparatus of claim 4, wherein the CRP comprises a disabling circuit to disable the voltage doubler after a predetermined time.

6. The apparatus of claim 5, wherein the disabling circuit comprises a Schmitt Trigger device.

7. The apparatus of claim 5, wherein the disabling circuit comprises a Time-to-Delay (TDC) converter.

8. The apparatus of claim 1, wherein the CRP comprises a combination of a voltage doubler and a voltage tripler.

9. The apparatus of claim 6, wherein the CRP comprises:
a first disabling circuit to disable the voltage doubler and to enable the voltage tripler after a first predetermined time; and
a second disabling circuit to disable the voltage tripler after a second predetermined time.

10. The apparatus of claim 1, wherein the CRP is shared with multiple different loads including the load.

11. The apparatus of claim 10 further comprises a logic to recover a charge from one or more of the multiple different loads which is in a sleep mode, and to provide the recovered charge to another load which is active.

12. The apparatus of claim 1, wherein the controllable device is a sleep transistor controllable by a sleep signal.

13. The apparatus of claim 1, wherein the CRP includes a capacitor which is shared with a decoupling capacitor.

14. An apparatus comprising:
a power supply node;
a plurality of processor cores;
a plurality of sleep transistors coupled to the first power supply node, each of the sleep transistors is coupled to a processor core of the plurality of processor cores, wherein each of the processor core has an internal power supply node coupled to the sleep transistor; and
a plurality of charge recovery pumps (CRPs), each of which is coupled to a processor core and the power supply node, each of the plurality of CRPs comprising a first switch, a second switch and a capacitor coupled to the first switch and the second switch, wherein the first switch is operable to couple the capacitor in parallel to the processor core during a first phase of a signal, and the second switch is operable to couple the capacitor in series to the processor core during a second phase of the signal.

15. The apparatus of claim 14, wherein each of the CRPs is operable to turn on when a sleep transistor coupled to that CRP is turned off.

16. The apparatus of claim 14, wherein each of the CRPs is operable to recover a charge from the internal power supply node and to provide the recovered charge to the power supply node.

17. The apparatus of claim 14, wherein each of the CRPs comprises a voltage doubler.

18. The apparatus of claim 17, wherein each of the CRPs comprises a disabling circuit to disable the voltage doubler after a predetermined time.

19. The apparatus of claim 18, wherein the disabling circuit comprises a Schmitt Trigger device.

20. The apparatus of claim 18, wherein the disabling circuit comprises a Time-to-Delay (TDC) converter.

21. The apparatus of claim 14, wherein each of the CRPs comprises a combination of a voltage doubler and a voltage tripler.

22. The apparatus of claim 21, wherein each of the CRPs comprises:
   a first disabling circuit to disable the voltage doubler and to enable the voltage tripler after a first predetermined time; and
   a second disabling circuit to disable to the voltage tripler after a second predetermined time.

23. A system comprising:
   a memory unit;
   a processor coupled to the memory unit, the processor having an apparatus according to any one of apparatus claims 14 to 22; and
   a wireless interface coupled to the processor to communicate with another device.

24. The system of claim 23 further comprises a display unit.

25. The system of claim 24, wherein the display unit is a touch screen.

* * * * *